(12) United States Patent
Shu et al.

(10) Patent No.: US 11,264,382 B2
(45) Date of Patent: Mar. 1, 2022

(54) FIN-TYPE FIELD EFFECT TRANSISTOR WITH REDUCED FIN BULGE AND METHOD

(71) Applicant: GlobalFoundries U.S. Inc., Malta, NY (US)

(72) Inventors: Jiehui Shu, Clifton Park, NY (US); Bharat V. Krishnan, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/942,816

(22) Filed: Jul. 30, 2020

(65) Prior Publication Data
US 2021/0005601 A1 Jan. 7, 2021

Related U.S. Application Data

(63) Continuation of application No. 16/459,678, filed on Jul. 2, 2019, now Pat. No. 10,811,411.

(51) Int. Cl.
*H01L 27/088* (2006.01)
*H01L 29/66* (2006.01)
(Continued)

(52) U.S. Cl.
CPC .. *H01L 27/0886* (2013.01); *H01L 21/823412* (2013.01); *H01L 21/823431* (2013.01);
(Continued)

(58) Field of Classification Search
CPC ........... H01L 27/0886; H01L 29/66545; H01L 29/6653; H01L 29/66795; H01L 29/66818;
(Continued)

(56) References Cited

U.S. PATENT DOCUMENTS 6,960,509 B1 11/2005 Han et al.
9,087,903 B2 7/2015 Huang et al.
(Continued)

OTHER PUBLICATIONS

Ishikawa et al., "Progress in Nanoscale Dry Processes for Fabrication of High-Aspect-Ratio Features: How Can We Control Critical Dimension Uniformity at the Bottom?", Japanese Journal of Applied Physics, 57, 06JA01,2018, pp. 1-19.
(Continued)

*Primary Examiner* — Dao H Nguyen
(74) *Attorney, Agent, or Firm* — Gibb & Riley, LLC; Francois Pagette

(57) ABSTRACT

Disclosed are a method of forming a fin-type field effect transistor (FINFET) and a FINFET structure. In the method, isolation regions are formed on opposing sides of a semiconductor fin. Each isolation region is shorter than the fin, has a lower isolation portion adjacent to a lower fin portion, and has an upper isolation portion that is narrower than the lower isolation portion and separated from a bottom section of an upper fin portion by a space. Surface oxidation of the upper fin portion thins the top section, but leaves the bottom section relatively wide. During gate formation, the gate dielectric layer fills the spaces between the bottom section of the upper fin portion and the adjacent isolation regions. Thus, the gate conductor layer is formed above any fin bulge area and degradation of gate control over the channel region due to a non-uniform fin width is minimized or avoided.

20 Claims, 19 Drawing Sheets

(51) Int. Cl.
*H01L 29/06* (2006.01)
*H01L 29/78* (2006.01)
*H01L 29/10* (2006.01)
*H01L 21/8234* (2006.01)

(52) U.S. Cl.
CPC .. *H01L 21/823481* (2013.01); *H01L 29/0649* (2013.01); *H01L 29/1033* (2013.01); *H01L 29/6653* (2013.01); *H01L 29/66545* (2013.01); *H01L 29/66795* (2013.01); *H01L 29/7851* (2013.01)

(58) Field of Classification Search
CPC ..... H01L 21/823431; H01L 21/823481; H01L 21/823412
USPC ....... 257/368, 369, 401, 288, 397, 347, 506, 257/E27.06, E27.103, E27.112, E27.024, 257/E27.081, E21.21, E21.409, E21.423, 257/E21.431, E21.635; 438/283, 282, 438/424, 437, 300, 275
See application file for complete search history.

(56) References Cited

U.S. PATENT DOCUMENTS

| | | | | |
|---|---|---|---|---|
| 9,985,043 | B2* | 5/2018 | Tsuda | H01L 29/42344 |
| 2007/0241420 | A1* | 10/2007 | Choi | H01L 29/42392 |
| | | | | 257/506 |
| 2014/0346612 | A1* | 11/2014 | Adam | H01L 29/6653 |
| | | | | 257/397 |
| 2015/0028426 | A1 | 1/2015 | Ching et al. | |
| 2015/0115334 | A1* | 4/2015 | Liaw | H01L 27/0886 |
| | | | | 257/288 |
| 2015/0115371 | A1 | 4/2015 | Ganz et al. | |
| 2015/0144998 | A1 | 5/2015 | Ching et al. | |
| 2017/0316984 | A1 | 11/2017 | Lin et al. | |
| 2019/0067115 | A1 | 2/2019 | Park et al. | |
| 2019/0067454 | A1 | 2/2019 | Hsu | |
| 2019/0131428 | A1* | 5/2019 | Huang | H01L 27/0886 |
| 2019/0326158 | A1* | 10/2019 | Chung | H01L 29/7846 |
| 2020/0083222 | A1* | 3/2020 | Kim | H01L 29/66545 |
| 2020/0119001 | A1 | 4/2020 | Shu et al. | |
| 2020/0135913 | A1 | 4/2020 | More et al. | |

OTHER PUBLICATIONS

Radamson et al., "The Challenges of Advanced CMOS Process from 2D to 3D", MDPI Applied Sciences, 2017, 7, 1047, pp. 1-32.
Gaynor et al., "Fin Shape Impact on FinFET Leakage with Application to Multithreshold and Ultralow-Leakage FinFET Design", IEEE Transactions on Electron Devices, 2014, pp. 1-7.
U.S. Appl. No. 16/459,678, Notice of Allowance dated Jul. 17, 2020, pp. 1-11.

* cited by examiner

FIN-TYPE FIELD EFFECT TRANSISTOR WITH REDUCED FIN BULGE AND METHOD

CROSS-REFERENCE TO RELATED APPLICATIONS

The present invention claims the benefit under 35 U.S.C. § 120 as a continuation of U.S. patent application Ser. No. 16/459,678 filed on Jul. 2, 2019, now issued as U.S. Pat. No. 10,811,411 on Oct. 20, 2020, the entire teachings of which are incorporated herein by reference.

BACKGROUND

Field of the Invention

The present invention relates to fin-type field effect transistors (FINFETs) and, more particularly, to a method of forming a FINFET and a resulting FINFET structure that includes a semiconductor fin having an essentially uniform width in the channel region.

Description of Related Art

Integrated circuit (IC) design decisions are often driven by device performance, device scalability, device density, manufacturing efficiency and costs. For example, size scaling of planar field effect transistors (FETs) resulted in the development of planar FETs with relatively short channel lengths but, unfortunately, the smaller channel lengths resulted in a corresponding increase in short channel effects. Fin-type FETs (FINFETs) were developed to minimize such short channel effects. A FINFET is a non-planar FET that incorporates one or more semiconductor fins (i.e., one or more elongated, relatively tall and thin, essentially rectangular-shaped, semiconductor bodies). Within each semiconductor fin, a channel region is positioned laterally between source/drain regions. A gate structure is positioned adjacent to the top surface and opposing sidewalls of the semiconductor fin at the corresponding channel region, respectively. Such a FINFET exhibits multi-dimensional field effects as compared to the single-dimensional field effects exhibited by a planar FET and, thus, exhibits improved gate control over the channel region. Conventional processing techniques used during FINFET formation on a bulk semiconductor substrate (e.g., bulk silicon substrate) often result in a semiconductor fin with a non-uniform width. For example, the semiconductor fin may have a first fin portion (also referred to herein as a base) positioned laterally between isolation regions and a second fin portion above the first fin portion (i.e., extending vertically above the isolation regions). The top section of the second fin portion can have an essentially uniform width, but the bottom section closest to the first fin portion (i.e., just above the level of the isolation regions) can bulge outward. This bulging of the semiconductor fin in the FINFET channel region can degrade gate control over the channel region and, thus, can degrade FINFET performance.

SUMMARY

Disclosed herein are embodiments of a semiconductor device structure and, particularly, a fin-type field effect transistor (FINFET). The FINFET can include a semiconductor substrate. Isolation regions can be on a surface of the semiconductor substrate and a semiconductor fin can extend out from the surface of the semiconductor substrate between the isolation regions. The semiconductor fin can have a lower portion (referred to herein as a first fin portion), which is adjacent to the semiconductor substrate, and an upper portion (referred to herein as a second fin portion), which is above the first fin portion. Each isolation region can have a lower portion (referred to herein as a first isolation portion), which is positioned laterally immediately adjacent to the first fin portion and which has a same height as the first fin portion, and an upper portion (referred to herein as a second isolation portion), which is above and narrower than the first isolation portion and which is shorter than the second fin portion. Thus, the second isolation portion is adjacent to, but physically separated from, the bottom section only of the second fin portion such that the top section of the second fin portion extends vertically above the isolation regions. Due to the processing techniques used to form the FINFET (e.g., see the discussion of the method embodiments below), the bottom section of the second fin portion may be wider than the top section (i.e., may include a fin bulge area).

The FINFET can further include a channel region, which is within the second fin portion of the semiconductor fin and positioned laterally between source/drain regions, and a gate structure adjacent to the top surface and opposing sides of the second fin portion at the channel region. The gate structure can include a gate dielectric layer and a gate conductor layer. The gate dielectric layer can conformally cover the second fin portion and can also fill spaces between the bottom section of the second fin portion and the second isolation portion of each of the adjacent isolation regions. The gate conductor layer can be on the gate dielectric layer and entirely above the level of the bottom section of the second fin portion. Since any fin bulge area is located in or below the bottom section of the second fin portion of a semiconductor fin and since the gate conductor layer is located entirely above the bottom section and, thereby entirely above the fin bulge area(s), degradation of gate control over the channel region due to a non-uniform fin width is minimized or avoided all together.

Also disclosed herein are embodiments of a method of forming the above-described fin-type field effect transistor (FINFET). Generally, the method embodiments can include forming a semiconductor fin that extends out from a surface of a semiconductor substrate and forming isolation regions on the surface of the semiconductor substrate adjacent to the semiconductor fin. Additional processing can also be performed in order to ensure each isolation region has a lower portion (referred to herein as a first isolation portion), which is above and immediately adjacent to the semiconductor substrate and which is further positioned laterally immediately adjacent to a lower portion of the semiconductor fin (referred to herein as the first fin portion), and an upper portion (referred to herein as a second isolation portion), which is above and narrower than the first isolation portion and which is further positioned laterally immediately adjacent to, but physically separated from, a bottom section only of an upper portion of the semiconductor fin (referred to herein as the second fin portion) such that a top section of the second fin portion extends vertically above the isolation regions. The method embodiments can further include forming a gate structure adjacent to a designated channel region in the second fin portion of the semiconductor fin. As discussed in greater detail below, conventional FINFET processing can result the bottom section of the second fin portion of a semiconductor fin being relatively wide (i.e., including a fin bulge area). In the embodiments of the method disclosed herein, this bottom section of the second fin portion is positioned laterally between, but physically separated by spaces from, second isolation portions of adjacent isolation regions, respectively. During gate structure formation, a conformal gate dielectric layer can be formed over the second fin portion of the semiconductor fin such that it also fills the spaces that separate the bottom section of the second fin portion from the second isolation portion of each of the adjacent isolation regions and a gate conductor layer can be formed on the gate dielectric layer. As a result, the gate conductor layer will be entirely above the bottom section of the second fin portion and, thereby above any fin bulge area such that degradation of gate control over the channel region due to a non-uniform fin width is minimized or avoided all together.

More specifically, one exemplary method embodiment can include forming a semiconductor fin that extends out from a surface of a semiconductor substrate. The semiconductor fin can have a lower portion (referred to herein as a first fin portion) adjacent to the surface of the substrate and an upper portion (referred to herein as a second fin portion) above the first fin portion.

A sacrificial layer can be formed on the surface of the semiconductor substrate such that the second fin portion extends vertically above the level of the top surface of the sacrificial layer. Next, sacrificial sidewall spacers can be formed on exposed opposing sidewalls of the second fin portion above the sacrificial layer. It should be noted that the sacrificial layer and the sacrificial sidewall spacers should comprise different sacrificial materials so as to allow for subsequent selective etching. The sacrificial layer can then be selectively removed, thereby exposing the surface of the semiconductor substrate and opposing sidewalls of the first fin portion below the sacrificial sidewall spacers. The process of selectively removing the sacrificial layer should be a selective isotropic etch process that leaves the sacrificial sidewall spacers intact on the second fin portion.

Next, a blanket isolation layer can be deposited over the partially completed structure and then recessed to form isolation regions. It should be noted that the process of recessing the blanket isolation layer should specifically be performed so that etching of the blanket isolation layer is stopped at some point when the level of the top surface of the blanket isolation layer is below the level of the top of the semiconductor fin and above the level of the bottoms of the sacrificial sidewall spacers. As a result, each isolation region will be shorter than the adjacent semiconductor fin, will have a lower portion (referred to herein as a first isolation portion), which is positioned laterally immediately adjacent to the first fin portion, and will have an upper portion (referred to herein as a second isolation portion), which is above and narrower than the first isolation portion and which is adjacent to, but physically separated from, a bottom section only of the second fin portion such that a top section of the second fin portion extends vertically above the isolation regions.

The sacrificial sidewall spacers can then be selectively removed and an oxidation process can be performed in order to form an oxide layer on the exposed surfaces of the second fin portion. It should be noted that this oxidation process consumes semiconductor material at the exposed surfaces of the second fin portion, thereby thinning the second fin portion. Furthermore, a lesser amount of semiconductor material consumption will occur within the bottom section of the second fin portion and, as a result, the bottom section will be wider than the top section (i.e., will have a fin bulge area).

A gate structure can subsequently be formed adjacent to the second fin portion of the semiconductor fin at a designated channel region, which is positioned laterally between source/drain regions. Specifically, conventional replacement metal gate processing can be performed. However, when a conformal gate dielectric layer is formed in a gate opening created by removal of a dummy gate structure, that conformal gate dielectric layer will cover the second fin portion and will also fill up the spaces between the bottom section of the second fin portion (which, as mentioned above, includes the fin bulge area) and the second isolation portions of the adjacent isolation regions, respectively. Thus, a gate conductor layer formed onto the gate dielectric layer in the gate opening will be entirely above the level of the bottom section of the second fin portion of the semiconductor fin and, thereby above a fin bulge area therein. As a result, degradation of gate control over the channel region due to a non-uniform fin width is minimized or avoided all together.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, conventional processing techniques used during fin-type field effect transistor (FINFET) formation on a bulk semiconductor substrate (e.g., bulk silicon substrate) often result in a FINFET structure that includes a semiconductor fin with a non-uniform width in the channel region. Specifically, the process flow typically begins with the formation of a semiconductor. Techniques for forming semiconductor fins are well known in the art and include, for example, lithographic patterning techniques and sidewall image transfer (SIT) techniques. Once the semiconductor fin is formed, a blanket isolation layer (e.g., a blanket silicon dioxide layer) can be deposited, polished to expose the top of the semiconductor fin, and then recessed to expose an upper portion of the semiconductor fin (i.e., a second fin portion) and to form isolation regions on the opposing sidewalls of a lower portion of the semiconductor fin (i.e., a first fin portion). Next, an oxidation process can be performed in order to form an extended gate (EG) oxide layer on the top surface and opposing sidewalls of the second fin portion. Additional FINFET processing can include, but is not limited to, the following: forming a dummy gate structure on the EG oxide layer opposite the top surface and opposing sidewalls of the second fin portion at the channel region; forming gate sidewall spacers; forming source/drain regions in the second fin portion on opposing sides of the dummy gate structure; depositing and polishing an interlayer dielectric (ILD) layer to expose the top of the dummy gate structure; selectively removing the dummy gate structure to form a gate opening (including optional removal of some or all of the exposed portion of the EG oxide layer from the gate opening); and forming a replacement metal gate structure in the gate opening.

Figure 1:
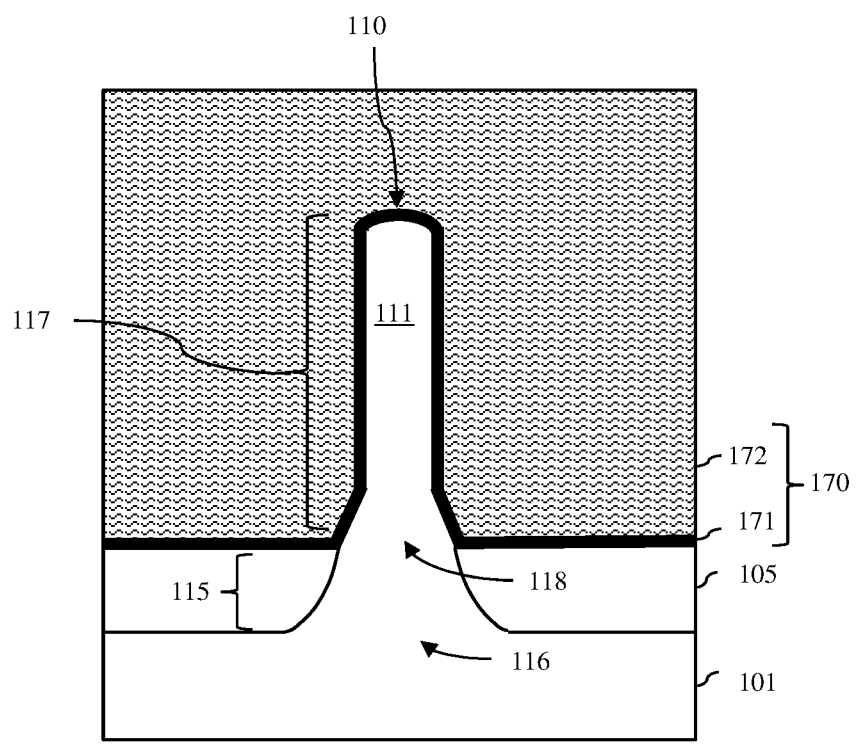
FIG. 1 is a schematic diagram illustrating fin bulge in a fin-type field effect transistor (FINFET)

The above-described process flow can result in a FINFET 100, as shown in FIG. 1. This FINFET 100 includes a semiconductor fin 110, which extends upward from a surface of a semiconductor substrate 101 (e.g., a bulk silicon substrate). The semiconductor fin 110 has a first fin portion 115 (also referred to as a base), which is positioned laterally between isolation regions 105, and a second fin portion 117 that is above the first fin portion 115 and extends vertically above the isolation regions. The FINFET structure 100 can further include a channel region 111 positioned laterally between source/drain regions (not shown) and a gate structure 170 (including a gate dielectric layer 171 and a gate conductor layer 172) adjacent to the opposing sides and top surface of the second fin portion 117 at the channel region 111. Due to an anisotropic etch process employed during semiconductor fin formation, the opposing sidewalls of the first fin portion 115, which are immediately adjacent to isolation regions 105, may be relatively wide (i.e., the first fin portion 115 may include a fin bulge area 116). Additionally, due to the oxidation process employed to form the EG oxide layer, semiconductor material at the surfaces of the second fin portion 117 is consumed, thereby thinning the second fin portion 117. However, those skilled in the art will recognize that a lesser amount of semiconductor material consumption will occur within the bottom section of the second fin portion 117 and, particularly, adjacent to the first fin portion 115 at the interface between the essentially vertically oriented sidewalls of the second fin portion 117 and the horizontally oriented tops of the isolation regions 105. Thus, this bottom section of the second fin portion 117 of the semiconductor fin 110 will be relatively wide (i.e., will include a fin bulge area 118) as compared to the top section of the second fin portion 117, which has an essentially uniform width or is only slightly tapered. In the FINFET channel region 111, the fin bulge area 118 can degrade gate control over the channel region 111 and, thus, can degrade FINFET performance.

In view of the foregoing, disclosed herein are embodiments of a method of forming a fin-type field effect transistor (FINFET) and the resulting FINFET structure, where degradation of gate control over the FINFET channel region caused by a non-uniform fin width is minimized or avoided all together.

Figure 2:
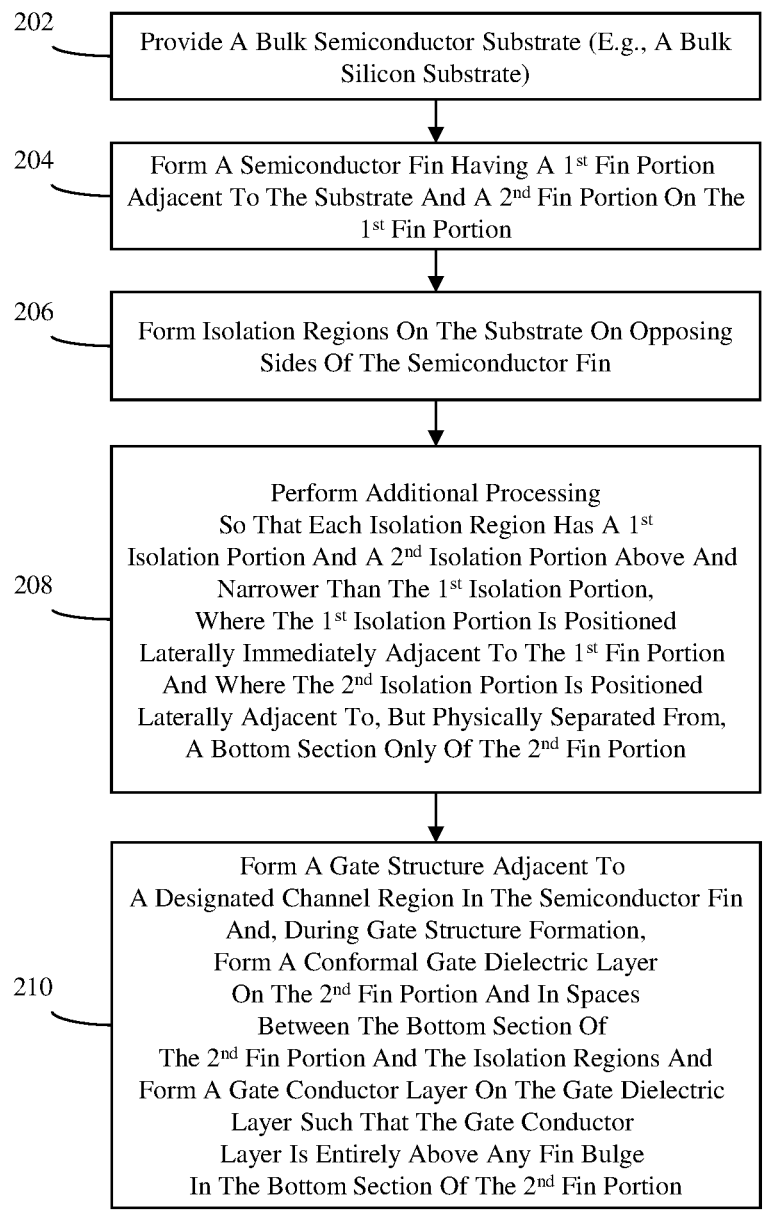
FIG. 2 is a flow diagram illustrating embodiments of a method of forming a FINFET.

More particularly, disclosed herein are embodiments of a method of forming a fin-type field effect transistor (FINFET). Referring to the flow diagram of FIG. 2, generally the method embodiments can include providing a bulk semiconductor substrate (see process step 202). At least one semiconductor fin can be formed on the semiconductor substrate such that it extends outward from a surface of the semiconductor substrate (see process step 204). Isolation regions can also be formed on the surface of the semiconductor substrate such that the semiconductor fin is positioned laterally between the isolation regions (see process step 206). During the above-mentioned process steps 204-206, additional processing can be performed (see process step 208).

The additional processing can specifically be performed in order to ensure each isolation region has a lower portion (referred to herein as a first isolation portion), which is above and immediately adjacent to the semiconductor substrate and which is further positioned laterally immediately adjacent to a lower portion of the semiconductor fin (referred to herein as the first fin portion), and an upper portion (referred to herein as a second isolation portion), which is above and narrower than the first isolation portion and which is further positioned laterally immediately adjacent to, but physically separated by a space from, a bottom section only of an upper portion of the semiconductor fin (referred to herein as the second fin portion) such that a top section of the second fin portion extends vertically above the isolation regions.

The method embodiments can further include forming a gate structure adjacent to a designated channel region in the second fin portion of the semiconductor fin (see process step 210). As mentioned above, conventional FINFET processing including an oxidation process used to form an extended gate (EG) oxide layer can result in the bottom section of the second fin portion of a semiconductor fin being relatively wide (i.e., including a fin bulge area). In the embodiments of the method disclosed herein, this bottom section of the second fin portion will be positioned laterally between, but physically separated by spaces from, second isolation portions of adjacent isolation regions, respectively. During gate structure formation, a conformal gate dielectric layer can be formed over the second fin portion of the semiconductor fin such that it also fills the spaces that separate the bottom section of the second fin portion from the second isolation portion of each of the adjacent isolation regions. The gate conductor layer can be formed on the gate dielectric layer and, since dielectric material fills the spaces around the bottom section of the second fin portion, the gate conductor layer will be entirely above that bottom section and, thereby above any fin bulge area such that degradation of gate control over the channel region due to a non-uniform fin width is minimized or avoided all together.

Figure 3:
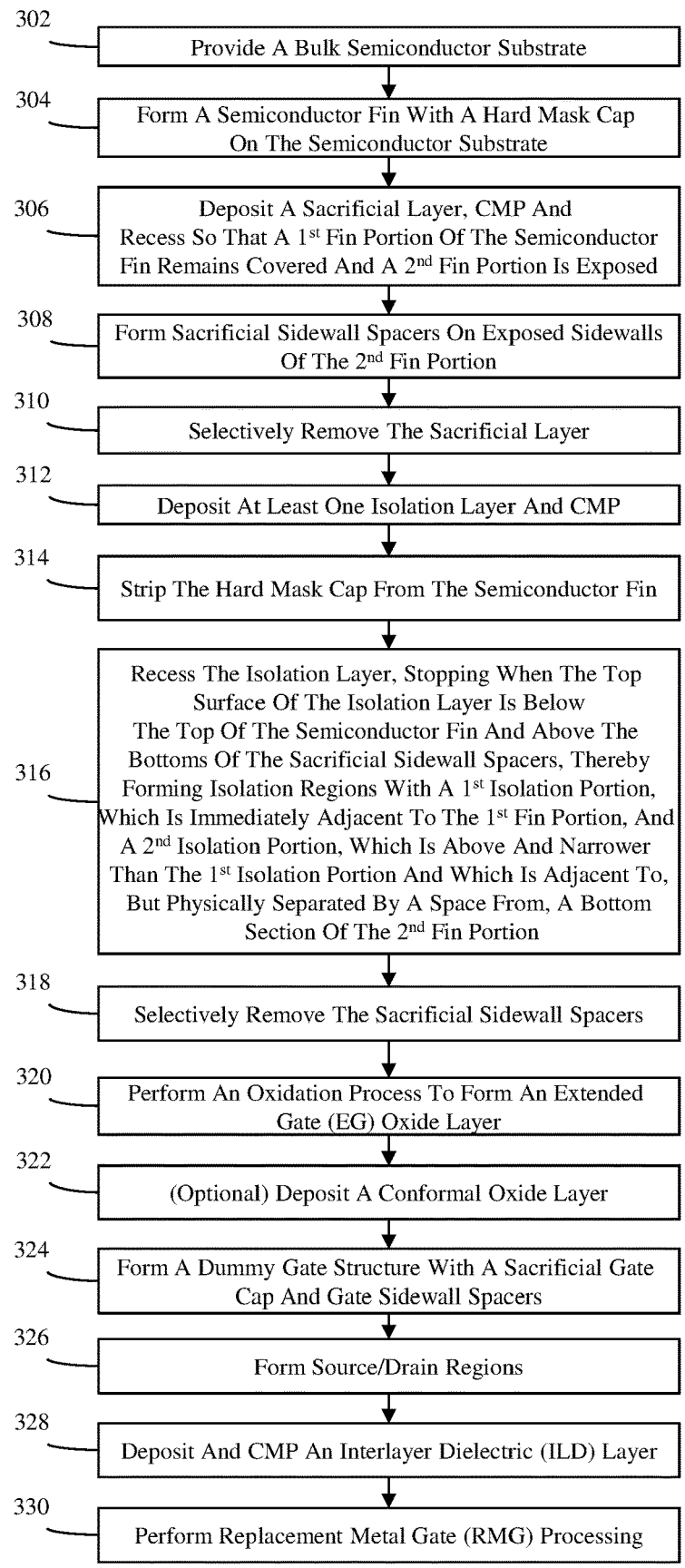
FIG. 3 is a flow diagram illustrating one exemplary embodiment of a method of forming a FINFET.

One exemplary method embodiment for forming a FINFET is described in greater detail below and illustrated in the flow diagram of FIG. 3.

Figure 4:
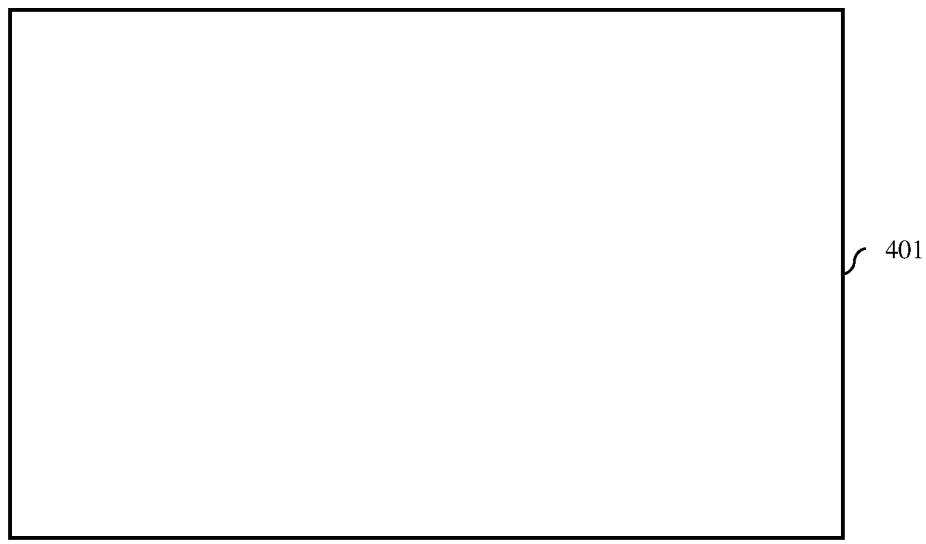
FIGS. 4-13 are cross-section diagrams illustrating partially completed FINFET structures, respectively, formed according to the flow diagram of FIG. 3.

The method can include providing a bulk semiconductor substrate 401 (see process step 302 and FIG. 4). The bulk semiconductor substrate provided at process step 302 can be a bulk silicon wafer or, alternatively, any other suitable bulk semiconductor wafer (e.g., a bulk silicon germanium wafer, etc.).

Figure 5:
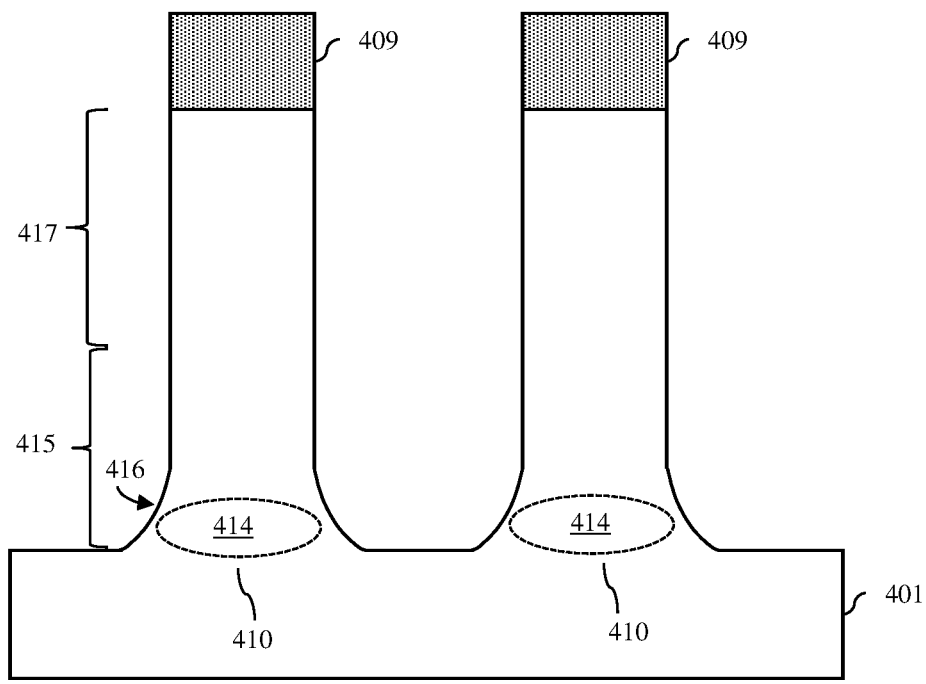

The method can further include forming one or more semiconductor fins 410 (e.g., one or more silicon fins) for a fin-type field effect transistor (FINFET) on the semiconductor substrate 401 (see process step 304 and FIG. 5). Conventional processing techniques can be employed to form the semiconductor fin(s) at process step 304. For example, lithographic processing techniques or sidewall image transfer (SIT) processing techniques could be employed to form fin mask(s) on the top surface of the semiconductor substrate. Such techniques are well known in the art and, thus, the details have been omitted form this specification in order to allow the reader to focus on the disclosed embodiments. Following fin mask formation, a selective anisotropic etch process can be performed in order to pattern the semiconductor fin(s) 410 into the upper portion of the semiconductor substrate 401.

For purposes of this disclosure, a "semiconductor fin" refers to a relatively thin, elongated, semiconductor body. Ideally, a semiconductor fin will have a three-dimensional rectangular shape with a uniform width from the bottom of the semiconductor fin adjacent to the substrate to the top of the semiconductor fin. However, those skilled in the art will recognize that a semiconductor fin formed using a selective anisotropic etch process, as described above, will typically have essentially vertical sidewalls except for at the base of the semiconductor fin, where the sidewalls flare out. That is, as illustrated in FIG. 5, each semiconductor fin 410 may have a lower portion (referred to herein as a first fin portion 415) and an upper portion (referred to herein as a second fin portion 417) that is above the first fin portion 415. The second fin portion 417 may have an essentially uniform width (as shown) or a width that tapers only slightly toward the top of the semiconductor fin 410. The first fin portion 415 may be wider than the second fin portion 417 above and, particularly, may have sidewalls that flare out from the second fin portion 417 down toward the substrate 401 (i.e., the first fin portion 415 may contain a fin bulge area 416). It should be noted that, following process step 304, the fin masks can remain in place such that the top of each semiconductor fin 410 is capped by a hard mask (HM) cap 409 (e.g., a silicon nitride cap).

FIG. 5 shows the formation of two semiconductor fins 410. The remaining process steps in the method for forming a FINFET are described in detail below and illustrated in the figures with respect to a FINFET that incorporates these two semiconductor fins 410. However, it should be understood that the description of the remaining process steps and figures are not intended to be limiting. Alternatively, a FINFET that incorporates a single semiconductor fin formed at process step 304 or that incorporates more than two semiconductor fins formed at process step 304 could be formed according to the disclosed method. Those skilled in the art will recognize that the number of semiconductor fins incorporated into a FINFET structure can be adjusted, by design, in order to achieve a desired drive current.

The semiconductor substrate 401 (or a region thereof within which the semiconductor fins are formed) can be doped so that the semiconductor fins 410 have the appropriate conductivity type for the channel region given the conductivity type of the FINFET being formed. Alternatively, following semiconductor fin formation at process step 304, a dopant implantation process can be performed so that the semiconductor fins 410 have the appropriate conductivity type. Those skilled in the art will recognize that, typically, the channel region of an N-type FET will be doped so as to have P-type conductivity at a relatively low conductivity level (i.e., P– conductivity), whereas the channel region of a P-type FET will be doped so as to have N-type conductivity at a relatively low conductivity level (N– conductivity).

Optionally, before or after forming the semiconductor fins 410 at process step 304, an additional dopant implantation process can be performed so that in the resulting FINFET structure a punch-through stopper (PTS) region 414 will be present in the first fin portion 415 adjacent to the surface of the semiconductor substrate 401. Those skilled in the art will recognize that a PTS region 414 is a heavily doped region included at the base of the semiconductor fin for the purpose of suppressing off-state leakage current. The PTS region 414 of an N-type FET will typically be doped so as to have P-type conductivity at a relatively high conductivity level (i.e., P+ conductivity), whereas the PTS region 414 of a P-type FET will be doped so as to have N-type conductivity at a relatively high conductivity level (N+ conductivity). Alternatively, a dielectric PTS region could be formed (e.g., by oxygen implantation).

Figure 6:
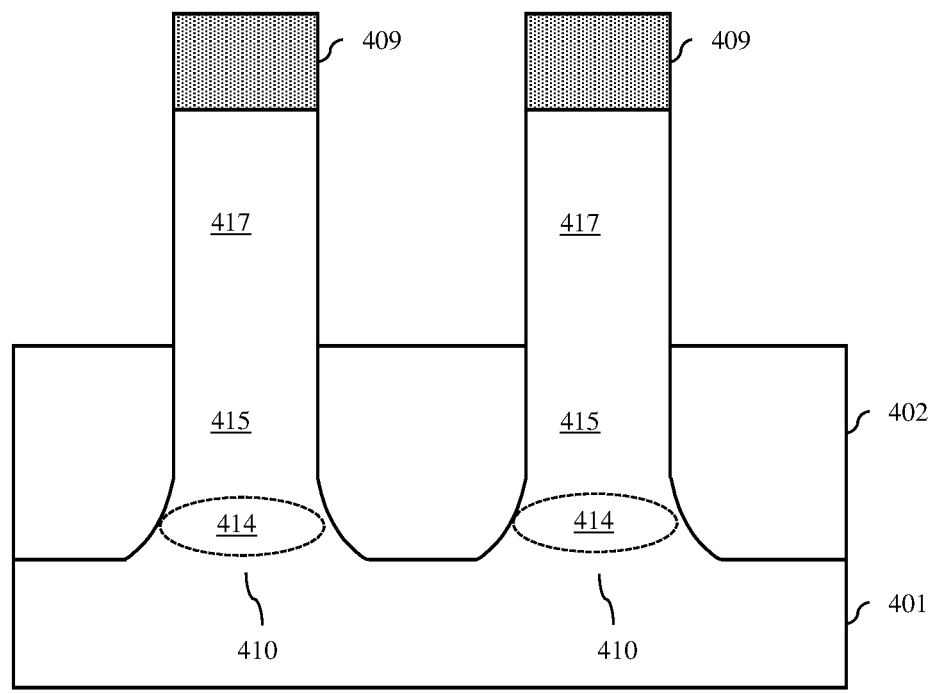

Next, a blanket sacrificial layer 402 can be formed (e.g., deposited) on the surface of the semiconductor substrate 401 and over the semiconductor fins 410 (see process step 306 and FIG. 6). This blanket sacrificial layer 402 can be, for example, a spin-on hard mask layer (e.g., a spin-on amorphous carbon hard mask layer) and an organic planarization layer (OPL). The blanket sacrificial layer 402 can, optionally, be polished (e.g., using a chemical mechanical planarization (CMP) process) to expose the caps 409 on the semiconductor fins 410 and then recessed (i.e., selectively etched back). Recessing of the blanket sacrificial layer 402 can be performed so that the first fin portion 415 remains covered by the second fin portion 417 is exposed (i.e., such that the second fin portion 417 extends vertically above the level of the top surface of the blanket sacrificial layer 402.

Figure 7:
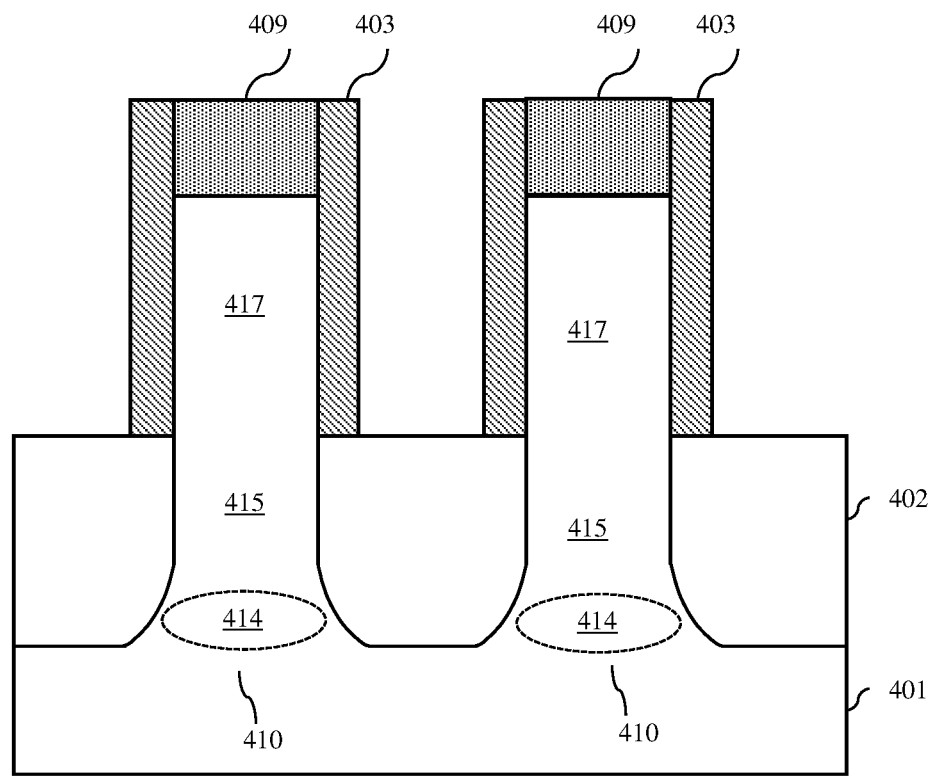

Once the sacrificial layer 402 is recessed, sacrificial sidewall spacers 403 can be formed on exposed opposing sidewalls of the second fin portions 417 of each semiconductor fin 410 above the sacrificial layer 402 (see process step 308 and FIG. 7). The sacrificial sidewall spacers 403 can be formed using conventional sidewall spacer formation techniques. That is, a conformal sacrificial layer can be deposited onto the sacrificial layer 402 and over the second fin portions 417 of the semiconductor fins 410 (e.g., by atomic layer deposition). Next, the conformal sacrificial layer can be selectively and anisotropically etched so as to remove horizontal portions of the conformal sacrificial layer from above the semiconductor fins 410 and the surface of the semiconductor substrate 401 adjacent to the semiconductor fins 410. It should be noted that the sacrificial layer 402 and the sacrificial sidewall spacers 403 should comprise different sacrificial materials so as to allow for subsequent selective etching. For example, as mentioned above the sacrificial layer 402 can be a spin-on hard mask or OPL layer, whereas the sacrificial sidewall spacers 403 can be titanium oxide ($TiO_2$), alumina ($Al_2O_3$), silicon nitride (SiN) or any other suitable dielectric layer that can be selectively etched away from the semiconductor fin 410 during subsequent processing.

Figure 8:
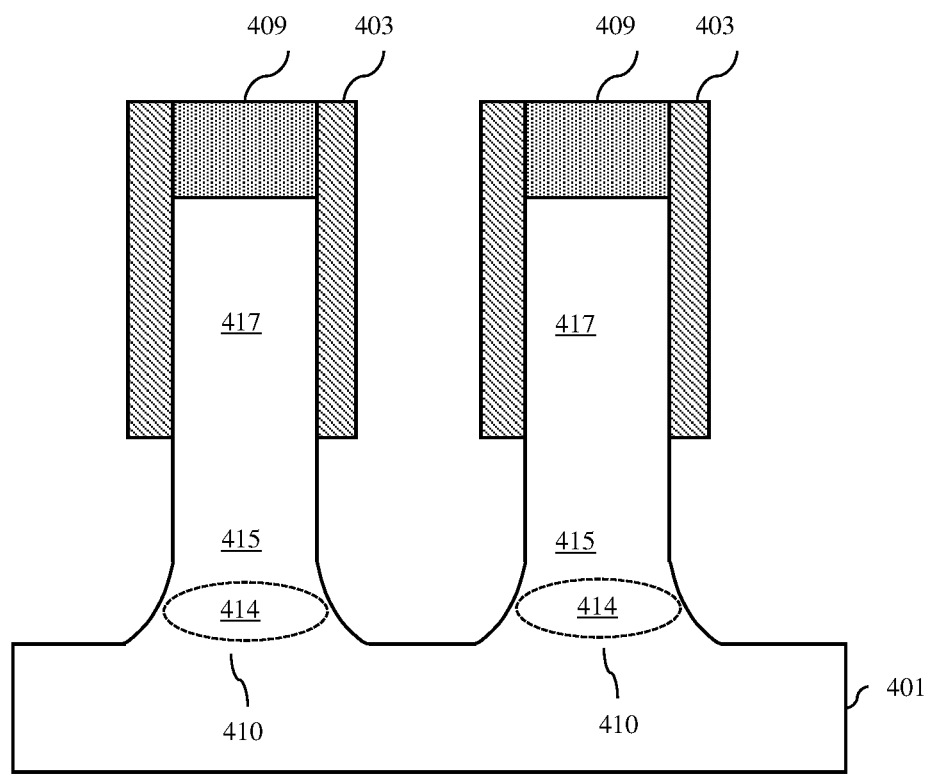

After the sacrificial sidewall spacers 403 are formed, the sacrificial layer 402 below can be selectively removed, thereby exposing the surface of the semiconductor substrate 401 and opposing sidewalls of the first fin portion 415 below the sacrificial sidewall spacers 403 (see process step 310 and FIG. 8). The process of selectively removing the sacrificial layer 402 should be a selective isotropic etch process that can remove the hard mask or OPL material of the sacrificial layer 402 without removing the sacrificial sidewall spacers 403 (i.e., leaving the sacrificial sidewall spacers 403 intact on the second fin portion 417).

Figure 9:
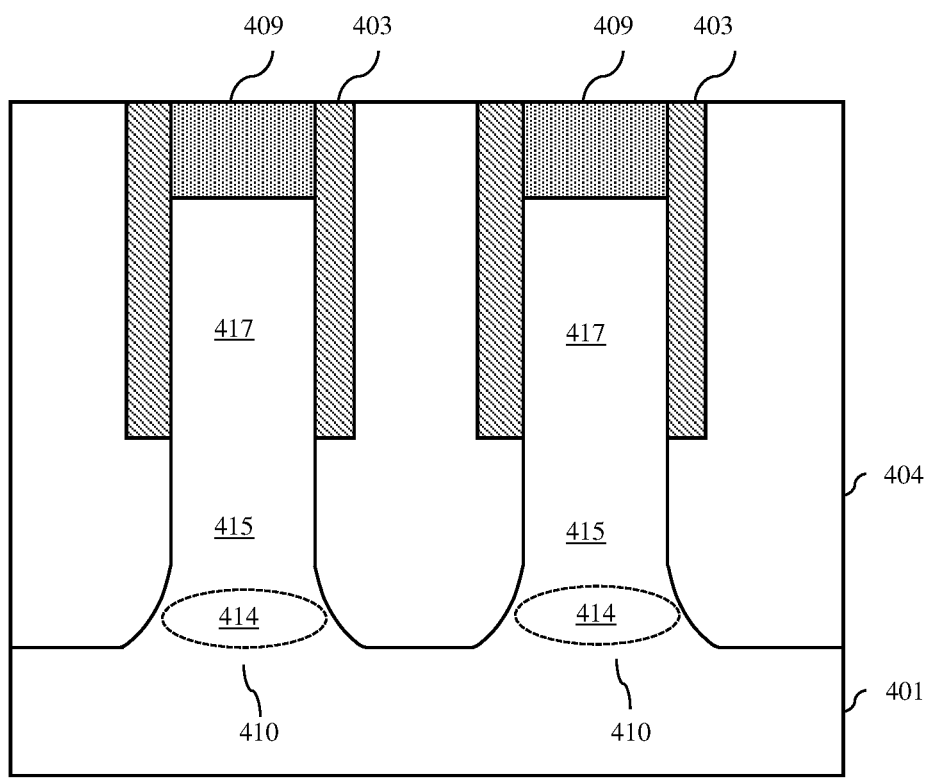

Next, at least one isolation layer 404 can be deposited over the partially completed structure and then polished (e.g., using a CMP process) to expose the hard mask (HM)

caps 409 on the tops of the semiconductor fins 410 (see process step 312 and FIG. 9). Specifically, at process step 312 a single blanket isolation layer could be deposited over the partially completed structure (as shown). This single blanket isolation layer could be a single blanket silicon dioxide layer or a single blanket layer of any other suitable isolation material. Alternatively, at process 312 one or more conformal isolation layers (i.e., dielectric liner(s)) could be deposited over the partially completed, followed by deposition of a blanket isolation layer (e.g., a blanket silicon dioxide layer or any other suitable isolation material). In any case, the isolation materials deposited at process step 312 should be different from the material of the sacrificial sidewall spacers 403 so that during subsequent processing the sacrificial sidewalls spacers can be selectively removed.

Figure 10:
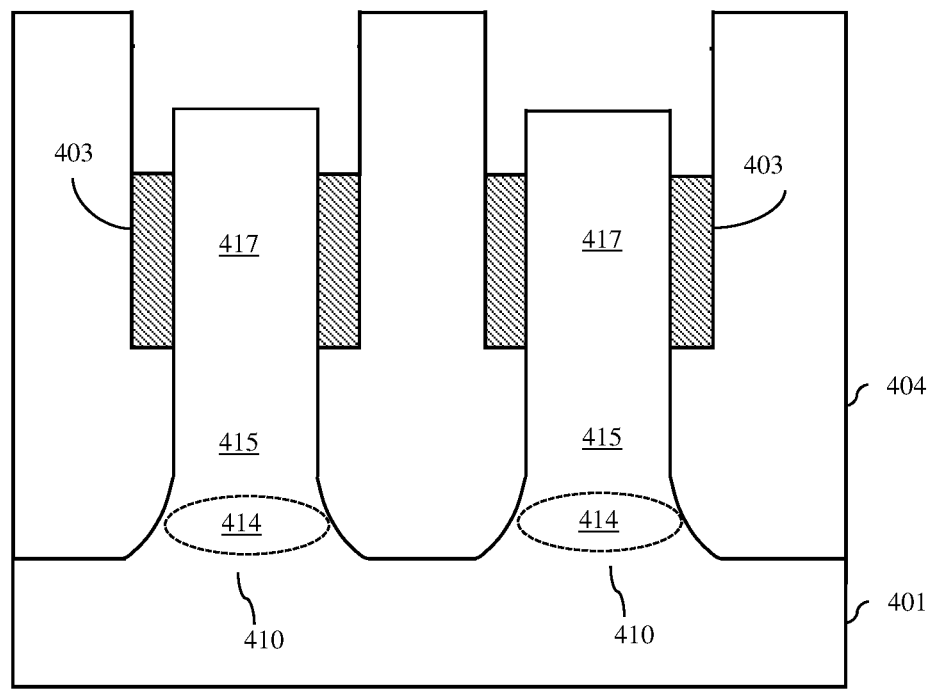

After the CMP process, the exposed HM caps 409 can be selectively removed (i.e., selectively etched away) from the semiconductor fins 410, thereby exposing the tops of the semiconductor fins 410 (see process step 314 and FIG. 10). It should be noted that if the HM caps 409 and the sacrificial sidewalls spacers 403 are both made of silicon nitride or both have similar etch properties, then the etch process used to remove the HM caps 409 may also etch back the sacrificial sidewalls spacers 403 to some degree so as to expose the upper corners at the top surface of the semiconductor fins 410 (as illustrated).

Figure 11:
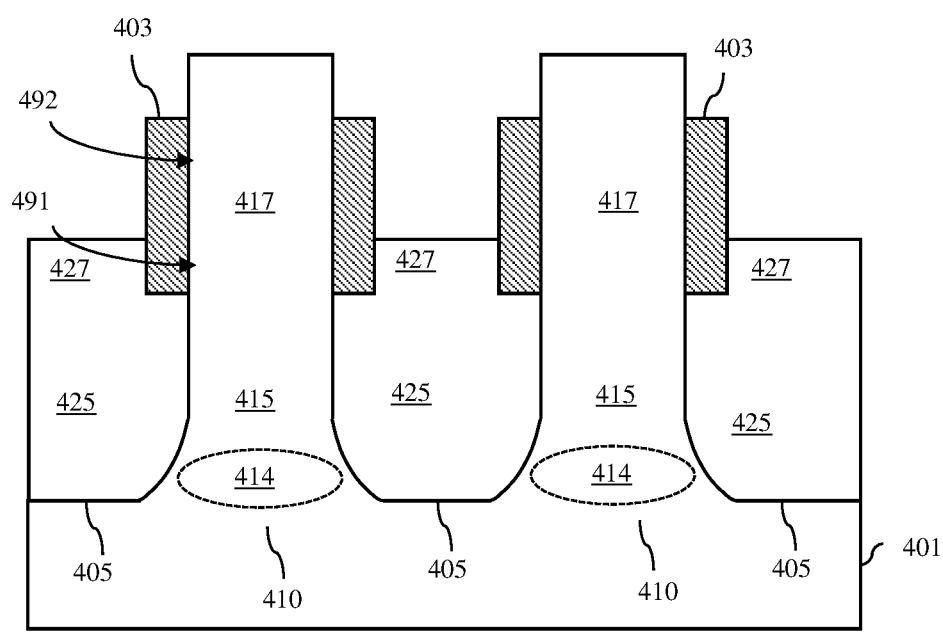

Following removal of the HM caps 409, the isolation layer(s) 404 can be recessed to form isolation regions 405 (see process step 316 and FIG. 11). It should be noted that the process of recessing the isolation layer(s) 404 should specifically be performed so that etching is stopped at some point when the level of the top surface of the blanket isolation layer and, if applicable, the exposed top ends of any conformal isolation layer deposited prior to deposition of the blanket isolation layer is/are below the level of the tops of the semiconductor fins 410 and above the level of the bottoms of the sacrificial sidewall spacers 403 (as illustrated). As a result, each isolation region 405 will be shorter than the adjacent semiconductor fins 410, will have a lower portion (referred to herein as a first isolation portion 425), which is positioned laterally immediately adjacent to the first fin portion 425, and will have an upper portion (referred to herein as a second isolation portion 427), which is above and narrower than the first isolation portion 425 and which is adjacent to, but physically separated by the sacrificial sidewall spacers 403 from, bottom sections 491 only the second fin portions 417 of the adjacent semiconductor fins 410 such that the top sections 492 of the second fin portions 417 of the adjacent semiconductor fins 410 extend vertically above the isolation regions 405.

Figure 12:
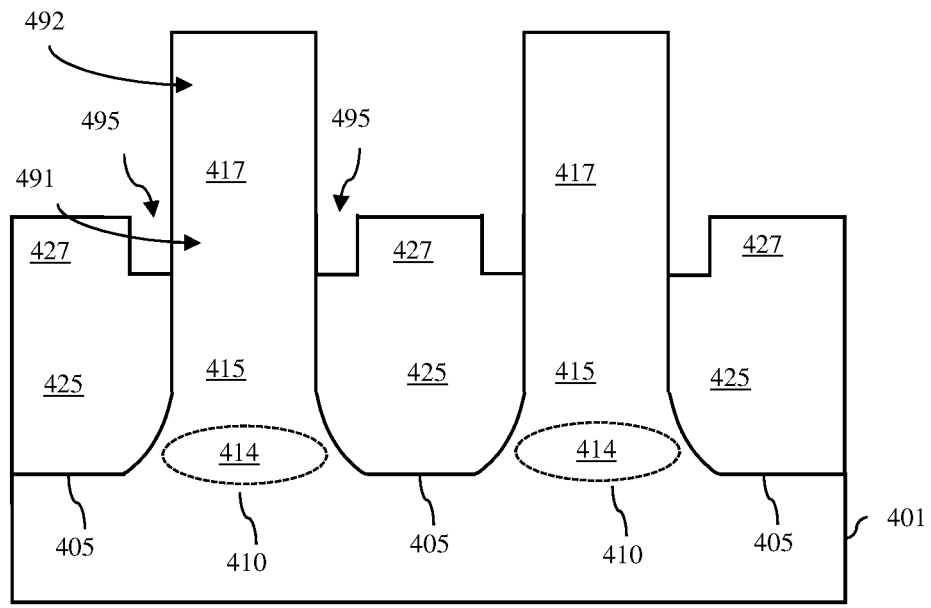

The sacrificial sidewall spacers 403 can then be selectively removed (e.g., using a selective isotropic etch process), thereby exposing the opposing sidewalls of the second fin portion 417 of each semiconductor fin 410 (including the sidewalls of the bottom section 491 of the second fin portion 417, which are exposed in the now empty spaces 495 (also referred to as divots or shallow trenches) that are between the bottom section 491 of the second fin portion 417 and the second isolation portions 427 of the adjacent isolation regions 405) (see process step 318 and FIG. 12). As mentioned above, the sacrificial sidewall spacers 403 and the isolation layer(s) 404 used for the isolation regions 405 should be different and, particularly, chosen so that the sacrificial sidewall spacers 403 can be selectively removed without significantly reducing the height of the isolation regions 405.

Figure 13:
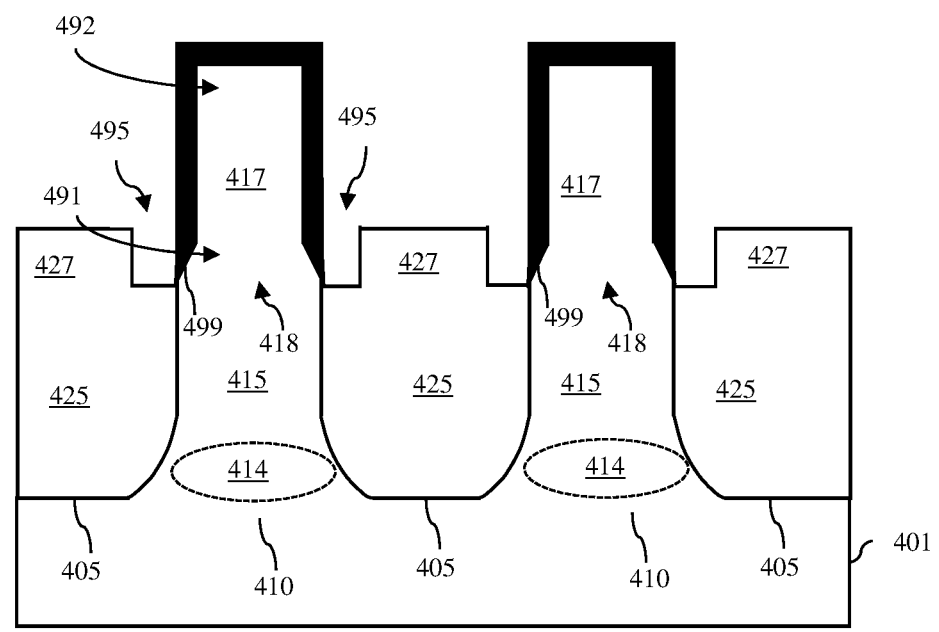

Once the sacrificial sidewall spacers 403 are removed, an oxidation process can be performed in order to form an extended gate (EG) oxide layer 499 on the exposed surfaces of the second fin portions 417 of each semiconductor fin 410 (see process step 320 and FIG. 13). It should be noted that this oxidation process consumes semiconductor material at the exposed surfaces of the second fin portion 417, thereby thinning the second fin portion 417 (i.e., reducing the width of the second fin portion 417). Furthermore, a lesser amount of semiconductor material consumption will occur within the bottom section 491 of the second fin portion 417 and, as a result, the top section 492 of the second fin portion 417 may have an approximately uniform width (as illustrated) or a width that tapers slightly toward the top of the semiconductor fin 410 and the bottom section 491 will be wider than the top section 492 (i.e., will have a fin bulge area 418).

Figure 14A:
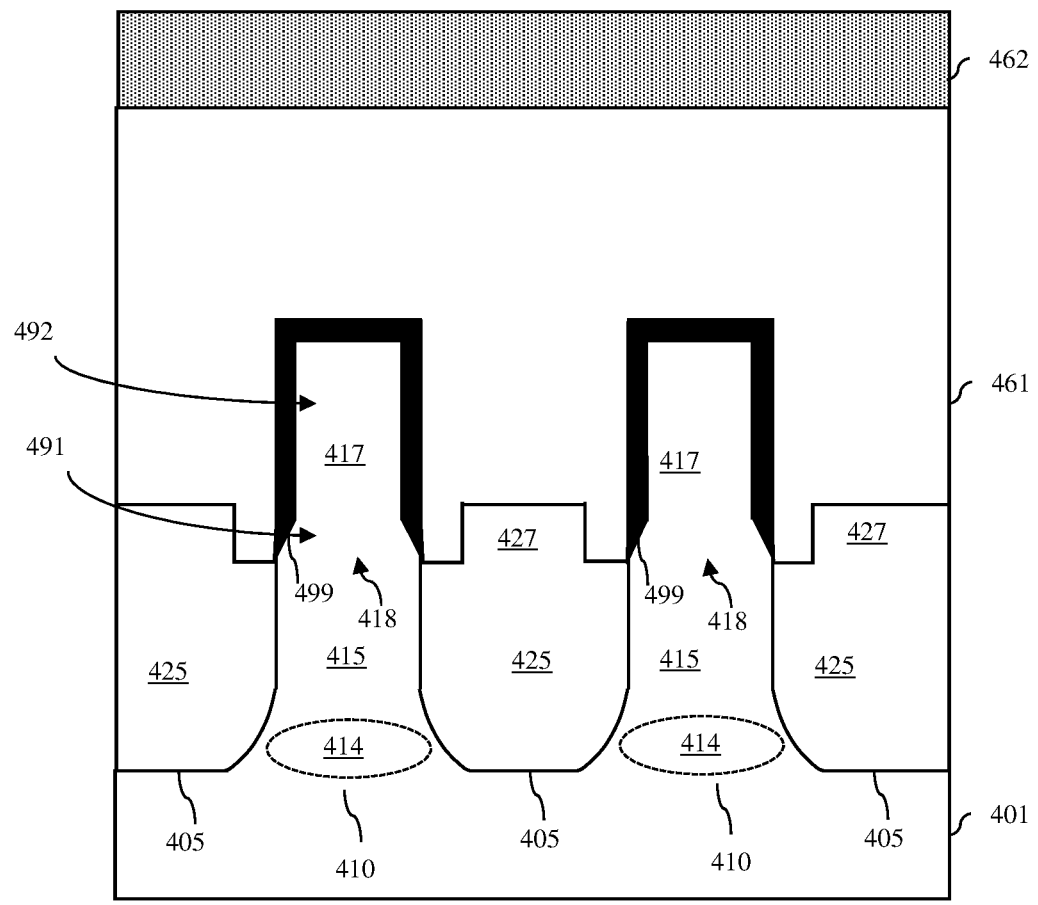
FIGS. 14A-14B are different cross-section diagrams illustrating a partially completed FINFET structure formed according to the flow diagram of FIG. 3.

Additional processing can then be performed in order to complete the FINFET structure. For example, a sacrificial gate 461 (referred to herein as a dummy gate structure) with a sacrificial gate cap 462 and a dielectric gate sidewall spacer 463 can be formed adjacent to the top surface and opposing sides of the second fin portion 417 of one or more semiconductor fins 410 at designated channel region(s) 411 in each fin (see process step 324 and FIGS. 14A-14B). To form such a sacrificial gate 461, a sacrificial gate layer (e.g., a sacrificial polysilicon layer or a sacrificial amorphous silicon layer) can be formed on the isolation regions above and adjacent to the opposing sides of the second fin portion 417 of the semiconductor fin(s) 410 (e.g., adjacent to the oxide layer 499). A polishing process (e.g., a CMP process) can be performed to ensure that the top surface of the sacrificial gate layer is essentially planar. Then, a second sacrificial gate cap layer (e.g., a sacrificial nitride layer, a silicon boron carbon nitride layer or other suitable dielectric layer), which is different from the sacrificial gate layer, can be formed on the top surface of the sacrificial gate layer. The sacrificial gate and gate cap layers can then be lithographically patterned and etched to form the sacrificial gate 461 with a sacrificial gate cap 462.

Optionally, dopant implantation processes can be performed in order to form source/drain extension regions (not shown) in the second fin portion 417 of each semiconductor fin 410 on either side of the channel region 411. For a P-type FINFET, the source/drain extension regions can be doped so as to have P-type conductivity at a relatively low conductivity level (i.e., P− conductivity), whereas for an N-type FINFET, the source/drain extension regions can be doped so as to have N-type conductivity at a relatively low conductivity level (i.e., N− conductivity). Alternatively, any other suitable source/drain extension doping specifications could be employed.

Figure 14B:
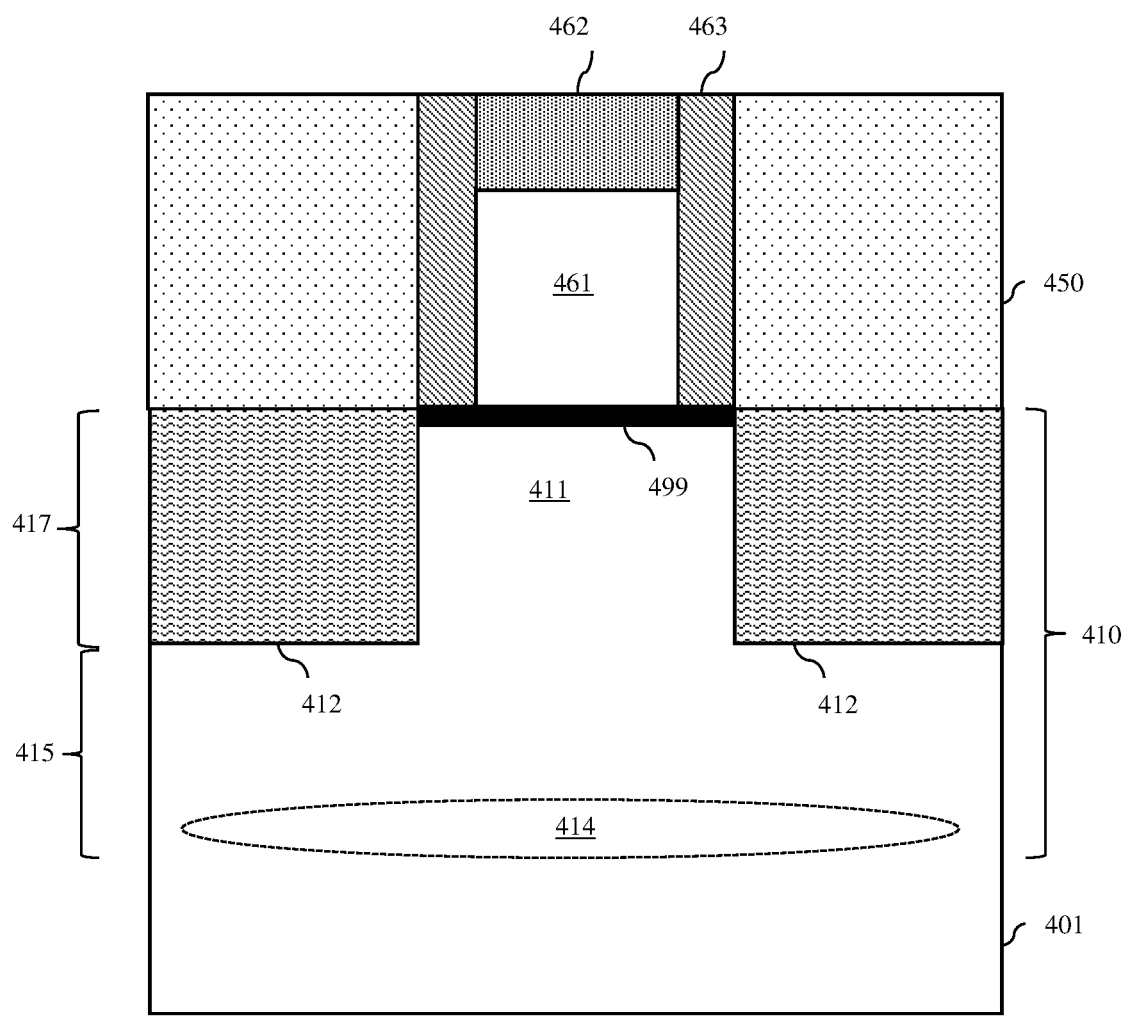

Gate sidewall spacers 463 can then be formed on the sidewalls of the sacrificial gate 461 (see FIG. 14B). The gate sidewall spacers 463 can be formed, for example, using conventional sidewall spacer formation techniques. Such sidewall spacer formation techniques are well known in the art and, thus, the details of those techniques have been omitted from the specification in order to allow the reader to focus on the salient aspects of the disclosed method. In any case, the gate sidewall spacers 463 can be made of silicon nitride, silicon carbon nitride, silicon boron carbon nitride or any other suitable gate sidewall spacer material that is different from the material used for the sacrificial gate 461.

After the gate sidewall spacers 463 are formed, source/drain regions 412 for the FINFET can be formed in the exposed sections of the second fin portion 417 of the semiconductor fin(s) 410, which extend laterally beyond the sacrificial gate 461 and gate sidewall spacers 463 (see process step 326 and FIG. 14B). For example, trenches can be etched in the exposed sections of the semiconductor fin(s) 410 and epitaxial semiconductor material can be deposited and in situ doped so as to form the source/drain regions 412. In the case of multi-fin FINFETs, the epitaxial semiconductor material can merge the source/drain regions of adjacent fins. In any case, for a P-type FIFNET, the source/drain regions 412 can be doped (using dopant implantation or in situ doping processes) so as to have P-type conductivity at a relatively high conductivity level (i.e., P+ conductivity), whereas for an N-type FIFNET, the source/drain regions can be doped so as to have N-type conductivity at a relatively high conductivity level (i.e., N+ conductivity). It should be noted that the epitaxial semiconductor material, described above, can be the same semiconductor material as that used for the semiconductor bodies (e.g., silicon). Alternatively, this epitaxial semiconductor material can be a different semiconductor material that is preselected for optimal device performance.

Next, an interlayer dielectric (ILD) layer 450 can be formed over the partially completed structure and then polished (see process step 328 and FIG. 14B). Specifically, a blanket ILD layer 450 (e.g., a blanket layer of silicon dioxide or some other suitable ILD material) can be deposited so as to cover the sacrificial gate cap 462, the gate sidewall spacers 463 and each source/drain region 412. The ILD layer 450 can then be polished (e.g., using a CMP process) so as to expose the tops of the sacrificial gate cap 462 and the adjacent gate sidewall spacers 463.

Figure 15A:
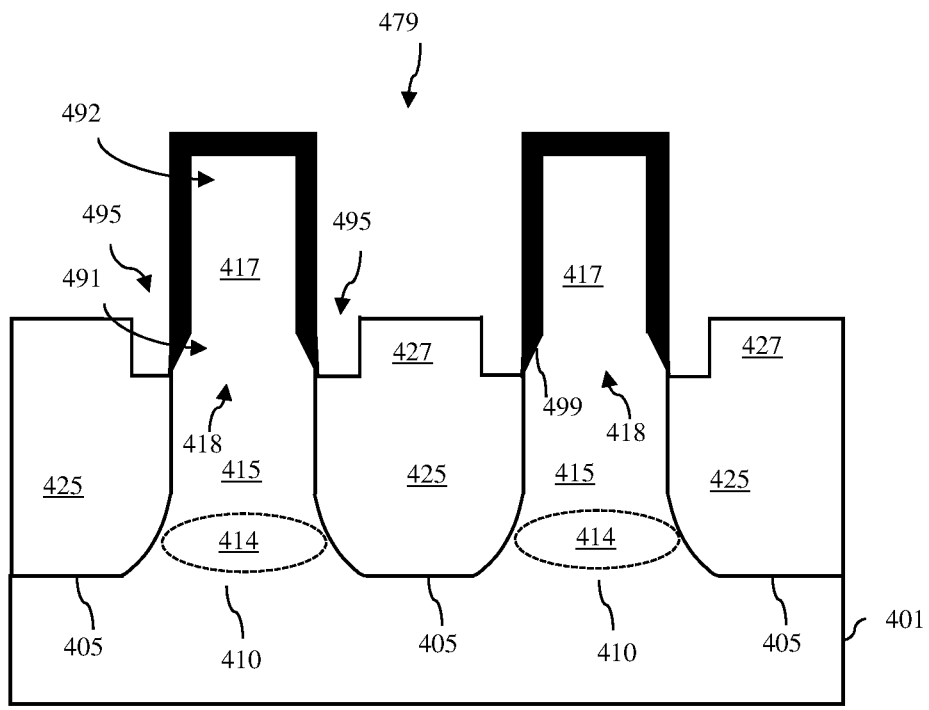
FIGS. 15A-15B are different cross-section diagrams illustrating a partially completed FINFET structure formed according to the flow diagram of FIG. 3.
Figure 15B:
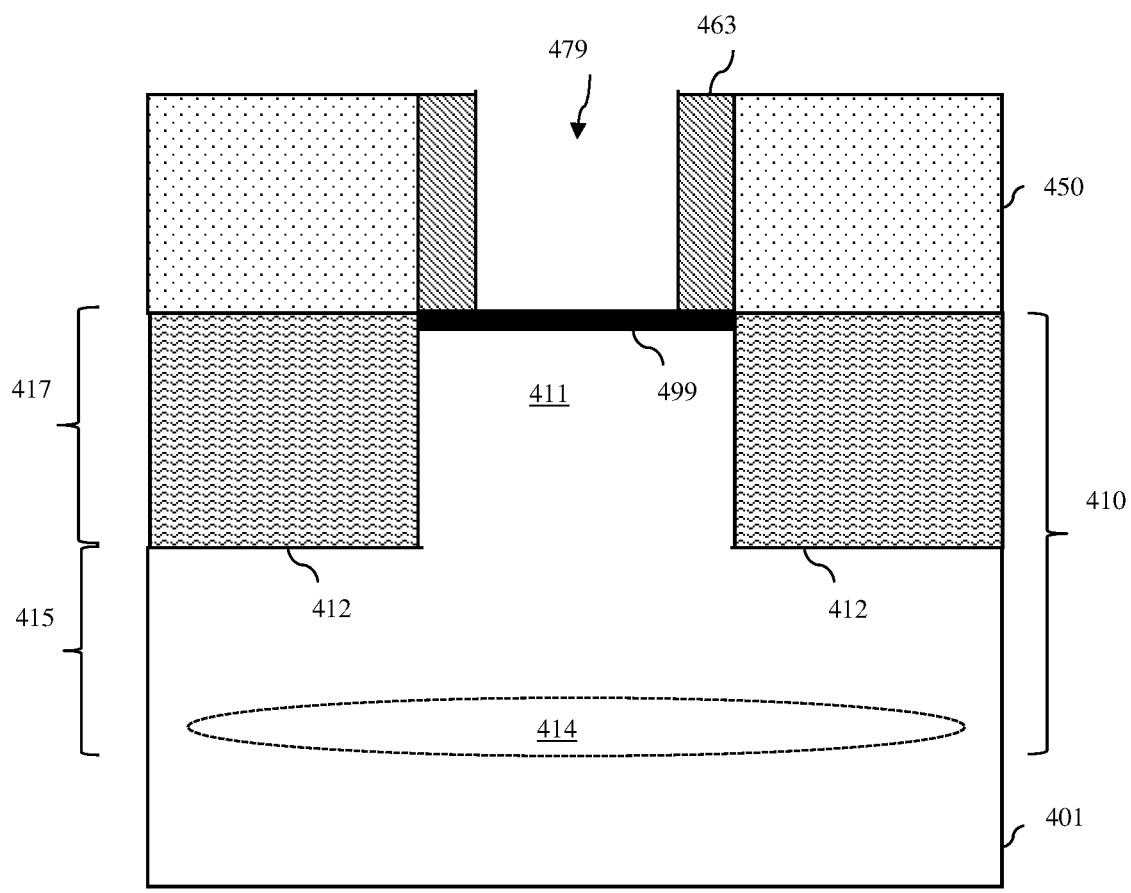

Replacement metal gate processing can then be performed (see process step 330). During RMG processing, the sacrificial gate 461 (i.e., the dummy gate structure) can be selectively removed to create a gate opening 479 (e.g., see FIGS. 15A-15B).

Next, a replacement metal gate (RMG) structure 470 can be formed within the gate opening 479. For example, a conformal gate dielectric layer 471 (such as a conformal high-K gate dielectric layer) can be deposited into the gate opening such that the dielectric material covers the top surface and opposing sides of each second fin portion 417 within the gate opening 479 and further fills the spaces 495 within the gate opening 479 between the bottom section 491 of each second fin portion 417 and the second isolation portions 427 of the adjacent isolation regions 405, respectively. Additionally, at least one gate conductor layer 472 can be formed in the gate opening 479 on the gate dielectric layer 471 and, particularly, can be deposited so as to fill any remaining space within the gate opening 479.

After the gate conductor material is deposited, it can be etched back and, more specifically, removed from the upper portion of the gate opening 479. Next, dielectric gate cap material can be deposited onto the ILD layer 450 and into the upper portion of the gate opening 479 on top of the gate conductor layer 472. A polishing process (e.g., a CMP process) can then be performed to remove the dielectric gate cap material from above the ILD layer 450, thereby forming a dielectric gate cap 473 and completing the RMG structure 470 (e.g., see FIGS. 16A-16B).

It should be noted that, when the sacrificial gate 461 is selectively removed to form the gate opening 479 during RMG processing at process step 330, the oxide layer 499 may (optionally) remain fully or partially intact. Thus, in the resulting FINFET structure 400A shown in FIGS. 16A-16B, the gate dielectric layer 471 of the RMG 470 may be positioned immediately adjacent to the oxide layer 499 and, thus, physically separated from surface of the semiconductor fin(s) 410.

Figure 17A:
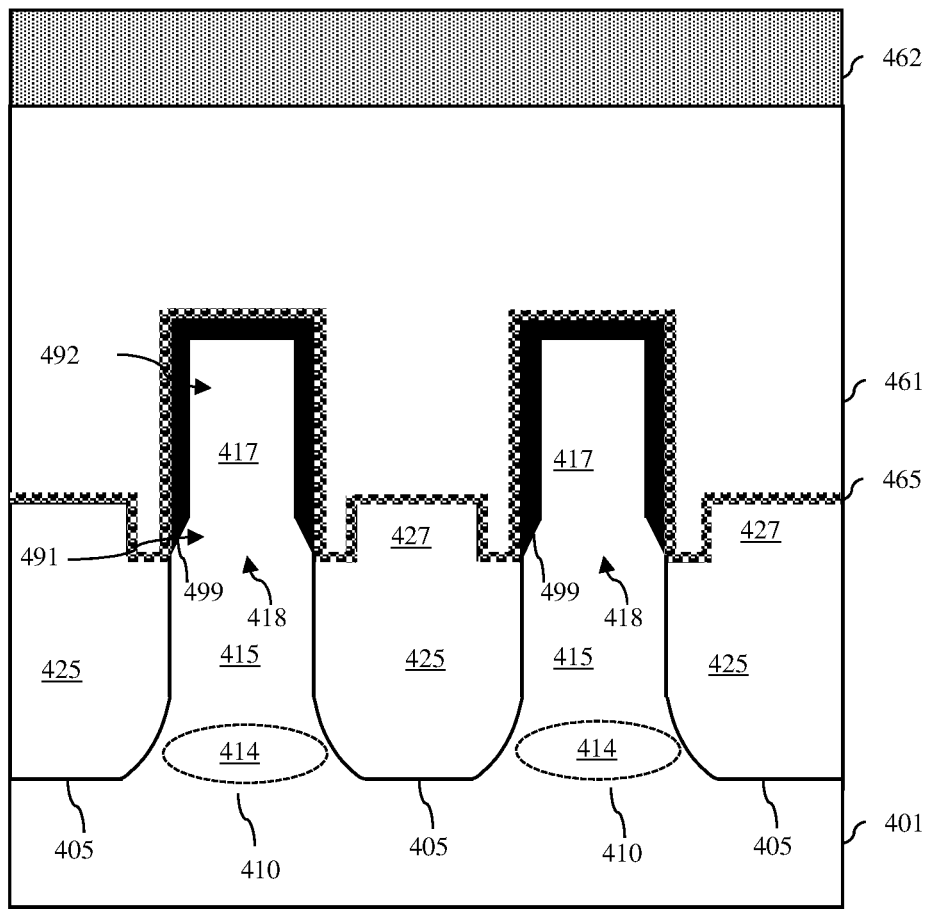
FIGS. 17A-17B are different cross-section diagrams illustrating an alternative partially completed FINFET structure formed according to the flow diagram of FIG. 3.
Figure 17B:
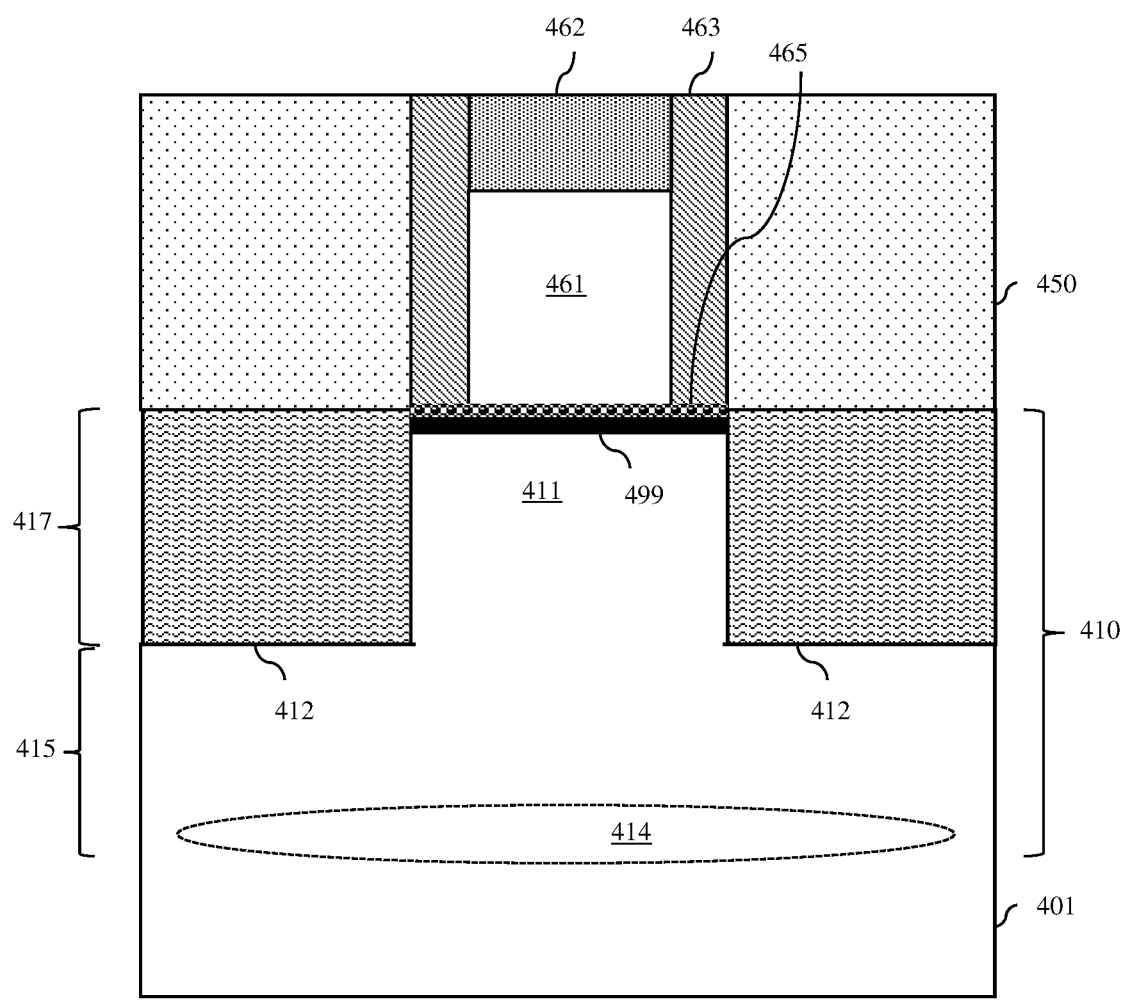
Figure 18A:
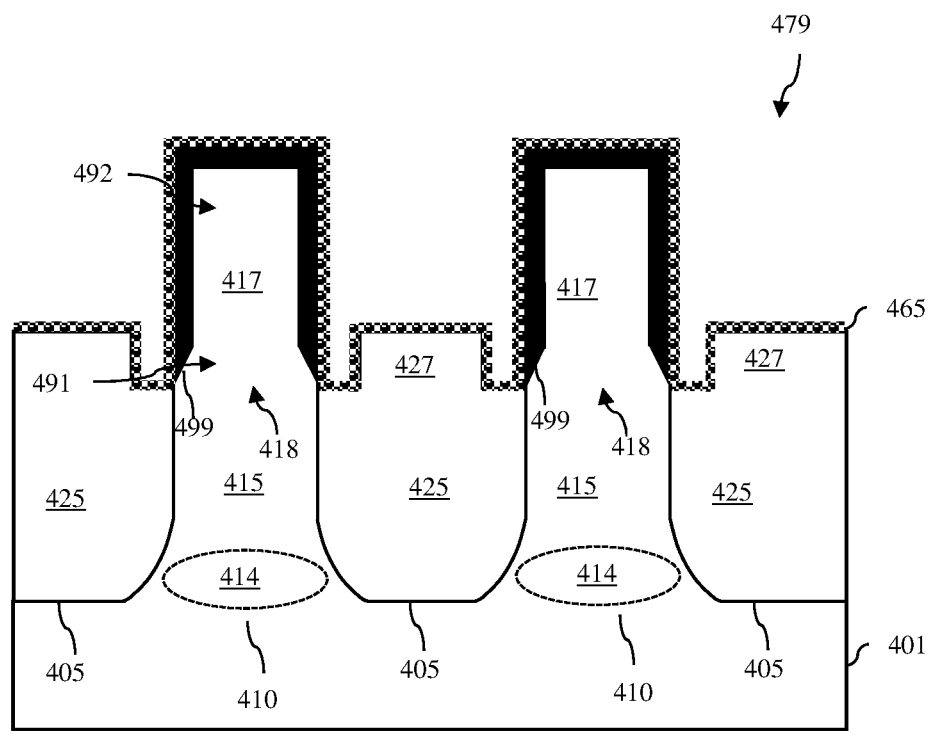
FIGS. 18A-18B are different cross-section diagrams illustrating an alternative partially completed FINFET structure formed according to the flow diagram of FIG. 3.
Figure 18B:
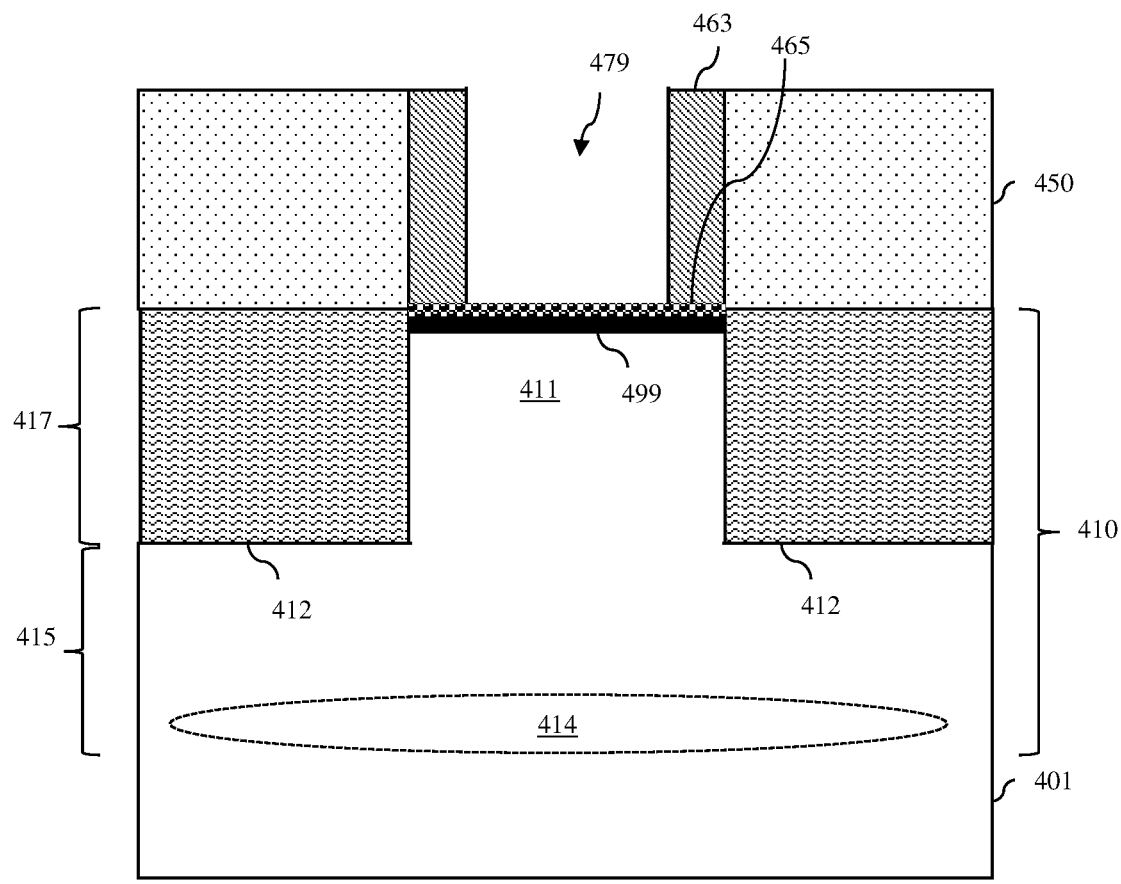

In alternative embodiments of the method, before the sacrificial gate 461 is formed at process step 324, an optional second oxide layer 465 can be deposited over the partially completed structure (e.g., see process step 322). This second oxide layer 465 can be a conformal oxide layer deposited, for example, by atomic layer deposition. In this case, the sacrificial gate 461 with sacrificial gate cap 462 and gate sidewalls spacers 463 can be formed on the second oxide layer 465 at process step 324 (e.g., see FIGS. 17A-17B). Furthermore, when the sacrificial gate 461 is selectively removed to form the gate opening 479 during RMG processing at process step 330, the conformal oxide layer 465 and the oxide layer 499 may (optionally) remain fully or partially intact within the opening 479 (e.g., see FIGS. 18A-18B). Thus, in the resulting FINFET structure 400B shown in FIGS. 19A-19B, the gate dielectric layer 471 of the RMG 470 may be positioned immediately adjacent to the conformal oxide layer 465 and, thus, physically separated from the surface of the semiconductor fin(s) 410.

Figure 20:
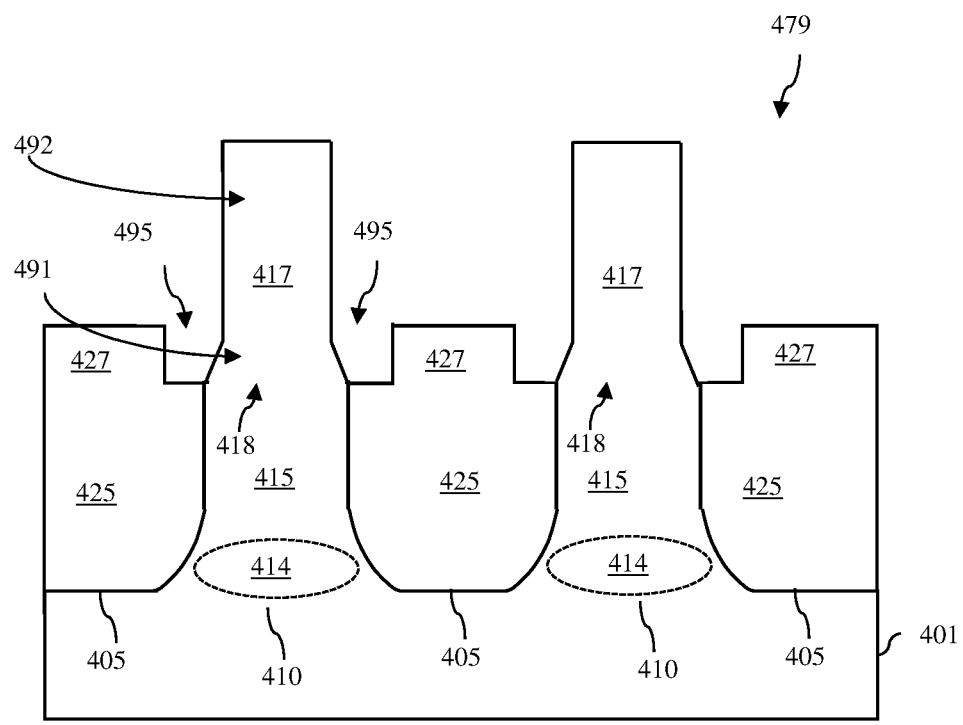
FIG. 20 is a cross-section diagrams illustrating another alternatively partially completed FINFET structure formed according to the flow diagram of FIG. 3.

In other alternative embodiments of the method, before the RMG 470 is formed within the gate opening 479 during RMG process at process step 330, any oxide material that is exposed within the gate opening 479 including oxide material from the oxide layer 499 and, if applicable, oxide material of the conformal oxide layer 465) can be removed. Removal of oxide material from the gate opening 479 can be performed during the same etch process used to remove the sacrificial gate 461. Additionally or alternatively, oxide material can be removed from the gate opening 479 through a discrete oxide etch or cleaning process (e.g., by buffered hydrofluoric acid (BHF) etch process) (e.g., see FIG. 20). Thus, in the resulting FINFET structure 400C shown in FIGS. 21A-21B, the gate dielectric layer 471 of the RMG 470 may be positioned immediately adjacent the top and opposing sidewall surfaces of the semiconductor fin(s) 410.

In any case, since the gate dielectric layer 471 is deposited so that it fills the spaces 495 between the bottom section 491 of the second fin portion 417 of each semiconductor fin 410 and the second isolation portions 427 of the adjacent isolation regions 405, respectively, the gate conductor layer 472 will be deposited so that it is entirely above the level of the bottom section 491 of each second fin portion 417 and, thereby above any fin bulge areas 416 or 418 within the semiconductor fin 410. As a result, degradation of gate control over the channel region 411 due to a non-uniform fin width is minimized or avoided all together.

Figure 16A:
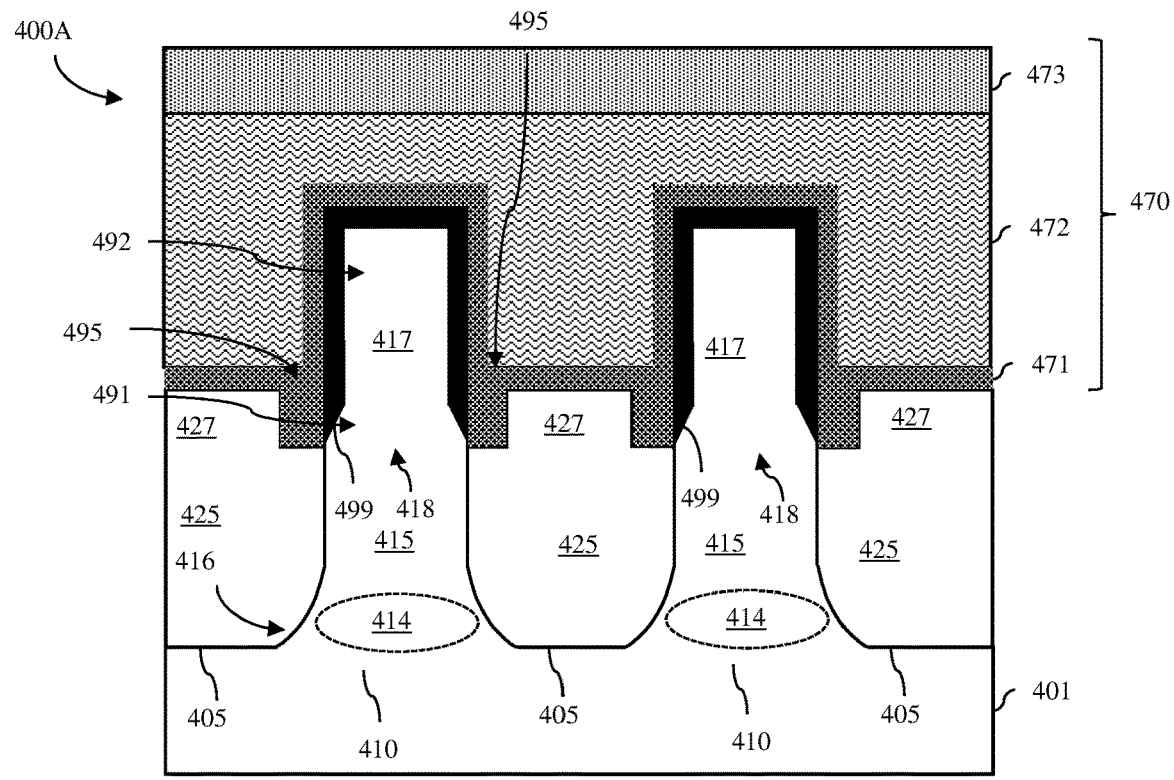
FIGS. 16A-16B are different cross-section diagrams illustrating an embodiment of a FINFET structure formed according to the flow diagram of FIG. 3.
Figure 16B:
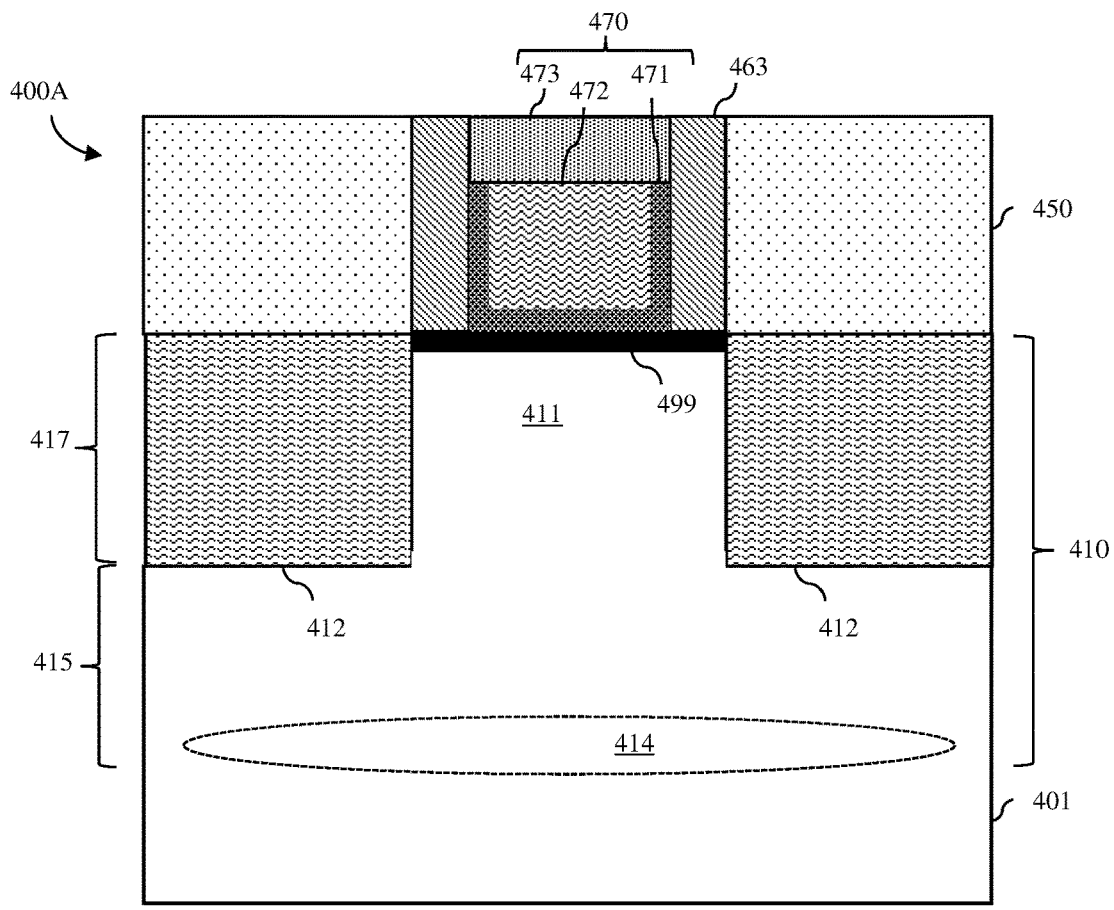
Figure 19A:
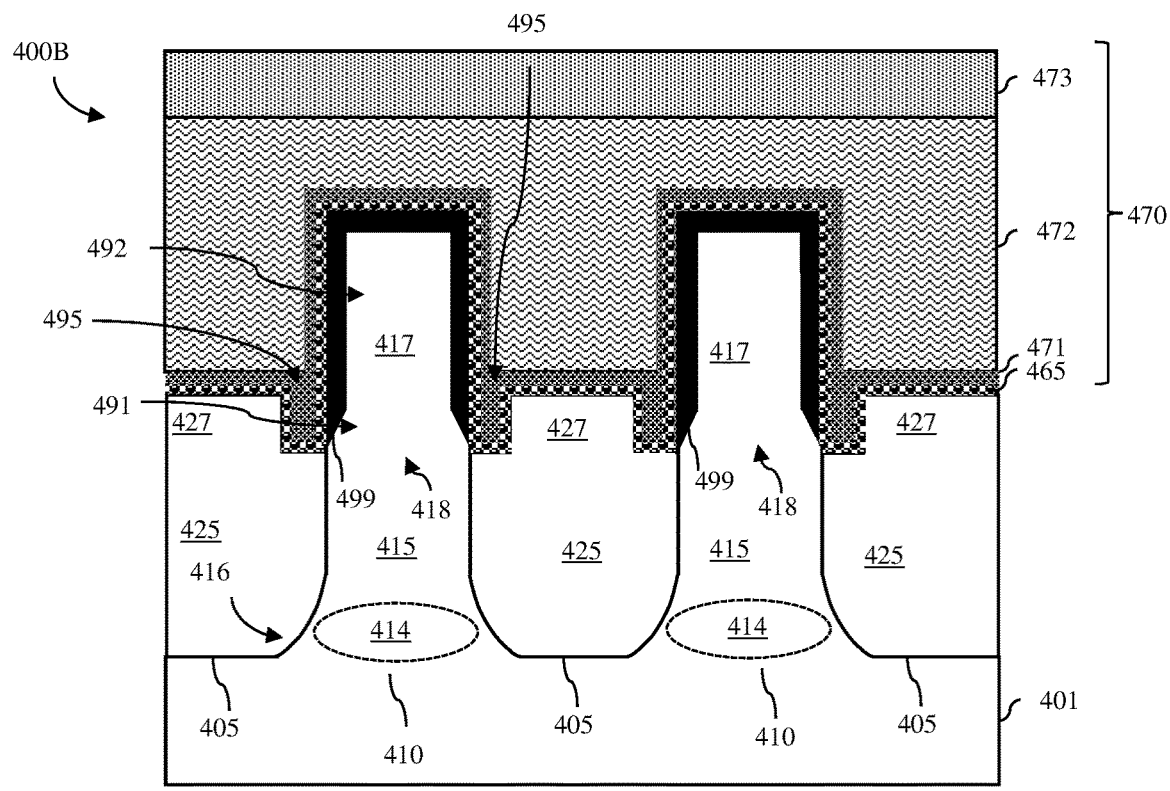
FIGS. 19A-19B are different cross-section diagrams illustrating another embodiment of a FINFET structure formed according to the flow diagram of FIG. 3.
Figure 19B:
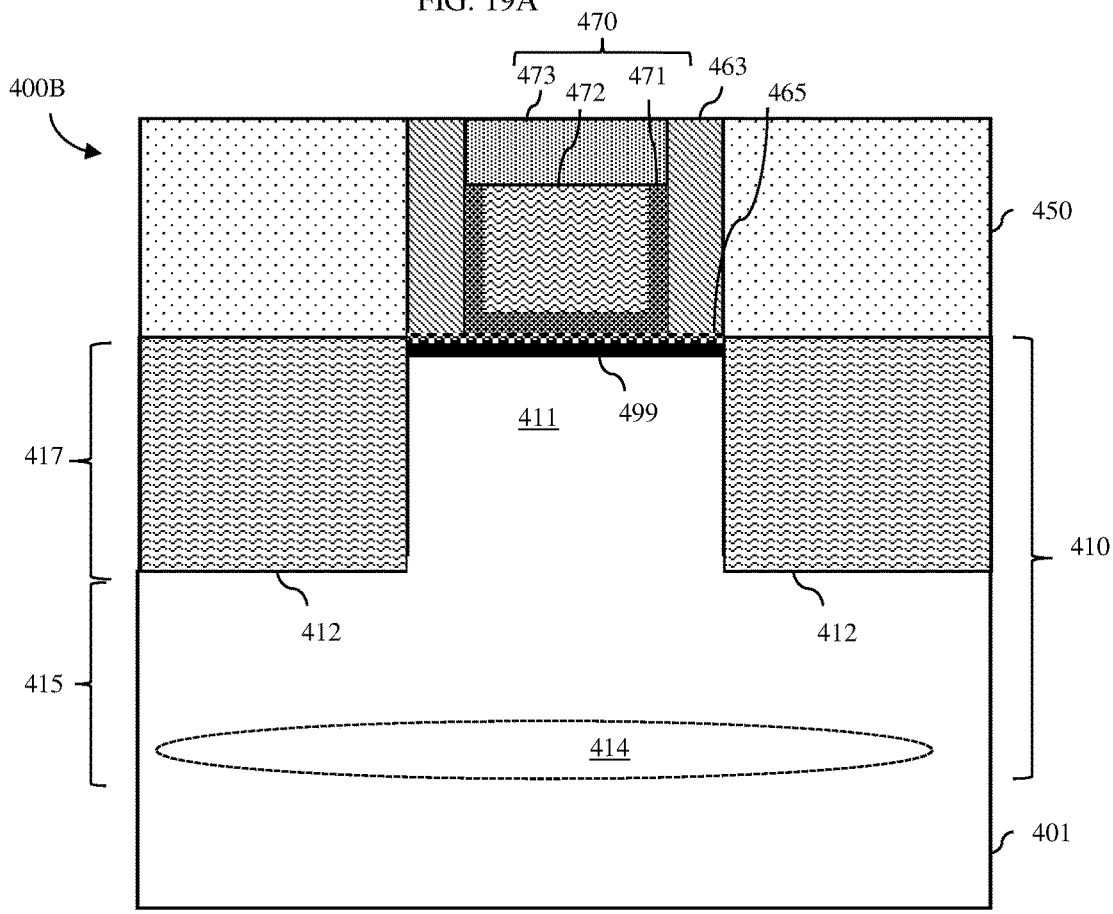
Figure 21A:
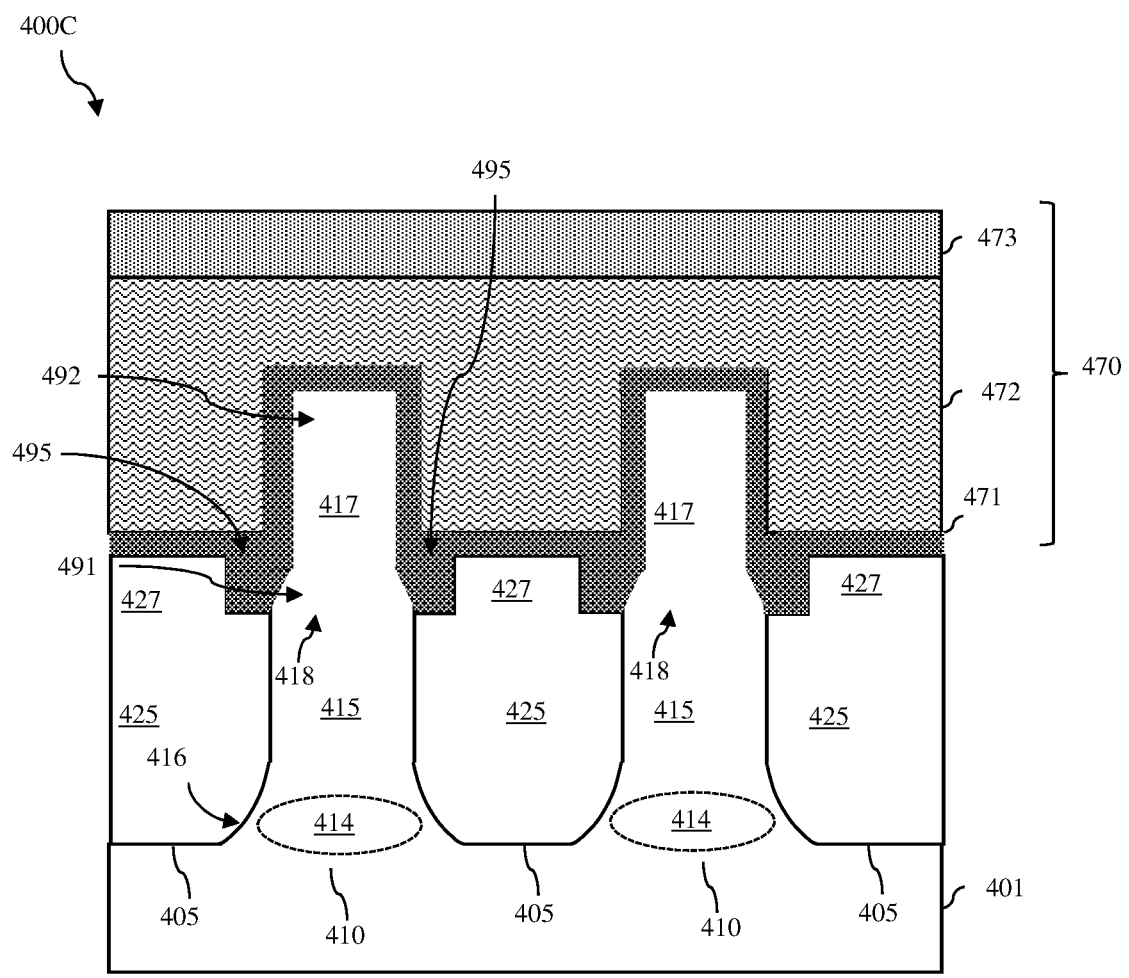
FIGS. 21A-21B are different cross-section diagrams illustrating yet another embodiment of a FINFET structure formed according to the flow diagram of FIG. 3.
Figure 21B:
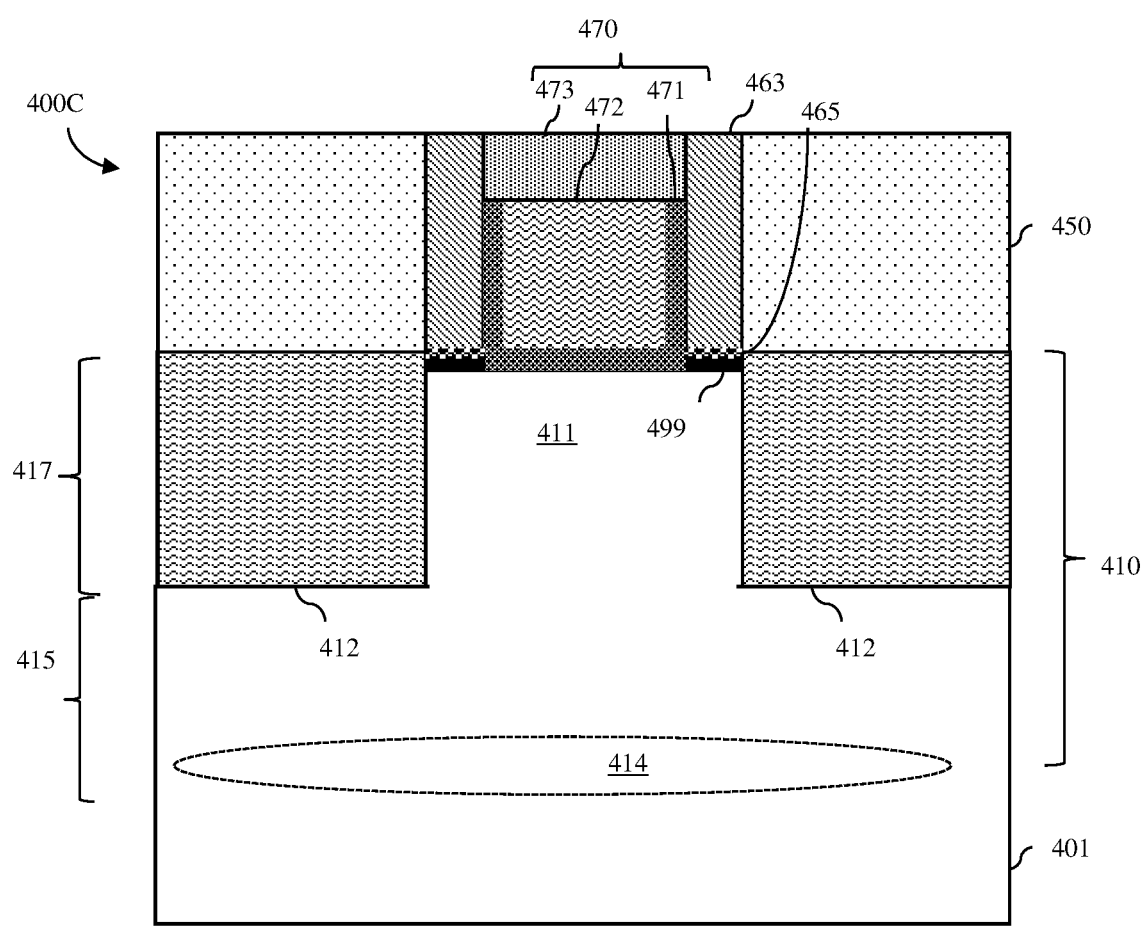

Also, disclosed herein are embodiments of a semiconductor device structure and, particularly, a fin-type field effect transistor (FINFET) (e.g., see FINFET structure 400A of FIGS. 16A-16B, FINFET structure 400B of FIGS. 19A-19B and FINFET structure 400C of FIGS. 21A-21B).

The FINFET structures 400A, 400B, 400C can each include a semiconductor substrate 401. The bulk semiconductor substrate can be a bulk silicon substrate or, alternatively, any other suitable bulk semiconductor substrate (e.g., a bulk silicon germanium substrate, etc.).

The FINFET structures 400A, 400B, 400C can each further include at least one semiconductor fin (e.g., a silicon fin) that extends outward from a surface of the semiconductor substrate 401. For purposes of this disclosure, a "semiconductor fin" refers to a relatively thin, elongated, semiconductor body. Each semiconductor fin 410 can have a lower portion (referred to herein as a first fin portion 415) and an upper portion (referred to herein as a second fin portion 417) that is above the first fin portion 415. Due to the processing techniques used to form the FINFET structures (e.g., see the discussion of the method embodiments above), the first fin portion 415 can be wider than the second fin portion 417 above and, particularly, can have sidewalls that flare out from the second fin portion 417 down toward the substrate 401 (i.e., the first fin portion 415 may contain a fin bulge area 416). The second fin portion 417 may have a bottom section 491, which is adjacent to the first fin portion 415, and a top section 492, which is above the bottom section 491. Due to the processing techniques used to form the FINFET structures (e.g., see the discussion of the method embodiments above), the top section 492 of the second fin portion 417 can have an approximately uniform width (as illustrated) or a width that tapers slightly toward the top of the fin and the bottom section 491 can be wider that the top section 492 (i.e., can include a fin bulge area 418).

As illustrated, the FINFET structures 400A, 400B and 400C each include two semiconductor fins 410. However, it should be understood that the description of the structures and figures are not intended to be limiting. Alternatively, the embodiments can include any number of one or more semiconductor fins 410 to achieve the desired drive current.

Optionally, the FINFET structures 400A, 400B, 400C can further include a punch-through stopper (PTS) region 414 in the first fin portion 415 adjacent to the surface of the semiconductor substrate 401. Those skilled in the art will recognize that a PTS region 414 is a heavily doped region included at the base of the semiconductor fin for the purpose of suppressing off-state leakage current. For an N-type FET, the PTS region 414 can be doped so as to have P-type conductivity at a relatively high conductivity level (i.e., P+ conductivity), whereas for a P-type FET, the PTS region 414 can be doped so as to have N-type conductivity at a relatively high conductivity level (N+ conductivity). Alternatively, the PTS region could be a dielectric region (e.g., an oxygen implant region).

The FINFET structures 400A, 400B, 400C can each further include isolation regions 405 on the surface of the semiconductor substrate 401 and each semiconductor fin(s) 410 can extend out from the surface of the semiconductor substrate 401 between a pair of adjacent isolation regions 405. As discussed above, each isolation region 405 adjacent to a given semiconductor fin 410 can have a lower portion (referred to herein as a first isolation portion 425) and an upper portion (referred to herein as a second isolation portion 427). The first isolation portion 425 can be above and immediately adjacent to the surface of the semiconductor substrate 401, can be positioned laterally immediately adjacent to the first fin portion 415 of the semiconductor fin 410 and can further be the same height as the first fin portion 415 of the semiconductor fin 410 (i.e., the tops of the first fin portion 415 and the first isolation portion 425 can be co-planar). The second isolation portion 427 can be above and narrower than the first isolation portion 425 and can further be shorter than the second fin portion 417. Thus, the second isolation portion 427 is adjacent to, but physically separated from, the bottom section 491 only of the second fin portion 417 such that the top section 492 of the second fin portion 417 of the semiconductor fin 410 extends vertically above the isolation regions 405.

It should be noted that each of the isolation regions can include one or more isolation layers. For example, each isolation region 405 can be made of a single isolation layer (e.g., a silicon dioxide layer or any other suitable isolation material layer) (as shown). Alternatively, each isolation region 405 can be a multi-layer isolation region that includes a conformal isolation layer (i.e., a dielectric liner) (not shown) and a blanket isolation layer on the conformal isolation layer. In this case, the conformal isolation layer would be at the bottom of the isolation region 405 immediately adjacent to the surface of the semiconductor substrate, at the sidewalls of the wider first isolation portion 425 of the isolation region 405 immediately adjacent to the first fin portion 415, at the upper corners of the first isolation portion 425 (i.e., below the space that separates the bottom section of the second fin portion 417 from the narrower second isolation portion 427 of the isolation region 405) and further at the sidewalls of the second isolation portion 427.

The FINFET structures 400A, 400B, 400C can each further include source/drain regions 412 and a channel region 411, which is positioned laterally between the source/drain region 412. The source/drain regions 412 can be, for example, epitaxial semiconductor-filled trenches in a second fin portion 417 of a semiconductor fin 410 and the channel region 411 can be a doped region within the second fin portion 417 of a semiconductor fin 410 between the source/drain regions 412. Optionally, in a multi-fin FINFET, the epitaxial semiconductor material of the source/drain regions 412 in adjacent fins can be merged. Also, optionally, the FINFET structures 400A, 400B, 400C can each further include source/drain extension regions (not shown) that extend laterally between the channel region 411 and the adjacent source/drain regions 412, respectively. Those skilled in the art will recognize that, typically, the channel region of an N-type FET will typically be doped so as to have P-type conductivity at a relatively low conductivity level (i.e., P− conductivity), whereas the channel region of a P-type FET will be doped so as to have N-type conductivity at a relatively low conductivity level (N− conductivity). The source/drain regions of an N-type FET will typically be doped so as to have N-type conductivity at a relatively high conductivity level (i.e., N+ conductivity), whereas the source/drain regions of a P-type FET will be doped so as to have P-type conductivity at a relatively high conductivity level (P+ conductivity). The source/drain extension regions of an N-type FET will typically be doped so as to have N-type conductivity at a relatively low conductivity level (i.e., N− conductivity), whereas the source/drain extension regions of a P-type FET will be doped so as to have P-type conductivity at a relatively low conductivity level (P− conductivity).

The FINFET structures 400A, 400B, 400C can each further include a gate structure 470 (e.g., a replacement metal gate (RMG) structure) adjacent to the top surface and opposing sides of the second fin portion 417 of each semiconductor fin 410 at a corresponding channel region 411. A dielectric gate cap 473 can be on the top surface of the gate structure 470 and gate sidewall spacers 463 can be positioned laterally adjacent to the sidewalls of the gate structure 470.

The RMG structure 470 can include one or more gate dielectric layers 471 (e.g., a high-K gate dielectric layer) and one or more gate conductor layers 472 (e.g., at least one metal gate conductor layer). In a single-fin FINFET, the gate dielectric layer 471 will cover the top surface and opposing sides of the second fin portion 417 of the semiconductor fin 410 at the channel region 411 and will further fill the spaces 495 (also referred to herein as divots or shallow trenches) between the bottom section 491 of the second fin portion 417 and the second isolation portions 427 of the adjacent isolation regions 405, respectively. In a multi-fin FINFET (as illustrated), the gate dielectric layer 471 will cover the top surface and opposing sides of the second fin portions 417 of the semiconductor fins 410 at the corresponding channel regions 411 and will further fill the spaces 495 between the bottom section 491 of each second fin portion 417 and the second isolation portions 427 of the isolation regions 405 on either side of the bottom section 491. In any case, the gate conductor layer 472 is on the gate dielectric layer 471 and, because the gate dielectric layer 471 fills the spaces 495 separating the fin(s) from the second isolation portions 427 of the adjacent isolation regions 405, the gate conductor layer 472 is entirely above the level of the bottom section 491 of the second fin portion 417 of any semiconductor fins 410 incorporated into the FINFET.

Referring specifically to the FINFET structure 400A shown in FIGS. 16A-16B, an oxide layer 499 (which, as mentioned above with regard to the method embodiments, is formed using an oxidation process) can be immediately adjacent to the top surface and opposing sides of the second fin portion 417 of each semiconductor fin 410 at the channel region 411. In this embodiment, the gate dielectric layer 471 of the RMG 470 is positioned immediately adjacent to the oxide layer 499 and, thus, physically separated from the surface of the semiconductor fin(s) 410.

Referring specifically to the FINFET structure 400B of FIGS. 19A-19B, a first oxide layer 499 (which, as mentioned above with regard to the method embodiments, can be formed using an oxidation process) may be immediately adjacent to the top surface and opposing sides of the second fin portion 417 of each semiconductor fin 410 at the channel region 411. Additionally, a conformal second oxide layer 465 (which, as mentioned above with regard to the method embodiments, can be formed by atomic layer deposition) may be on the first oxide layer 499. In this embodiment, the gate dielectric layer 471 of the RMG 470 is positioned immediately adjacent to the second oxide layer 465 and, thus, physically separated from surface of the semiconductor fin(s) 410 by the stacked oxide layers 499 and 465.

Referring specifically to the FINFET structure 400C of FIGS. 21A-21B, oxide material (e.g., from the oxide layers 499 and/or 465) can be selectively removed from the surface of the second fin portion 417 of each semiconductor fin(s) 410 at the channel region 411 prior to RMG 470 formation. Thus, in this embodiment, the gate dielectric layer 471 of the RMG 470 is positioned immediately adjacent to the top surface and opposing sides of the second fin portion 417 of each semiconductor fin 410 at the channel region 411.

In any case, since the gate dielectric layer 471 fills the spaces 495 between the bottom section 491 of second fin portion 417 of each semiconductor fin 410 and the second isolation portions 427 of the adjacent isolation regions 405, respectively, the gate conductor layer 472 is entirely above the level of the bottom section 491 and, thereby above any fin bulge areas (e.g., 416 and/or 418) contained within the semiconductor fin 410. As a result, degradation of gate control over the channel region 411 due to a non-uniform fin width is minimized or avoided all together.

In addition to the components described above the FINFET structures 400A, 400B, 400C can further include an interlayer dielectric (ILD) layer 450 on the source/drain regions 412 and positioned laterally adjacent to the gate sidewall spacers 463. The ILD layer 450 can be a silicon dioxide layer or a layer of some other suitable ILD material.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on.

Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

Also, in the method and structure embodiments described above, a high-K gate dielectric layer refers to a layer of dielectric material with a dielectric constant that is greater than the dielectric constant of silicon dioxide (i.e., greater than 3.9). Exemplary high-K dielectric materials that can be used for the gate dielectric layer can include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Additionally, in the method and structure embodiments described above, the gate conductor layer(s) can include, for example, a work function metal layer and a conductive fill material layer. The work function metal layer can be preselected so as to have a work function suitable for both N-type FET and P-type FET operation. Alternatively, the work function metal layer can be pre-selected for optimal work function depending upon the conductivity type of the FET. Those skilled in the art will recognize that the optimal work function for a gate conductor of a P-type FET will be, for example, between about 4.9 eV and about 5.2 eV. Exemplary metals (and metal alloys), which have a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Those skilled in the art will further recognize that the optimal work function for a gate conductor of an N-type FET will be, for example, between 3.9 eV and about 4.2 eV. Exemplary metals (and metal alloys), which have a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The conductive fill material layer can be, for example, doped polysilicon or any suitable metal or metal alloy fill material including, but not limited to, tungsten, a tungsten alloy (e.g., tungsten silicide or titanium tungsten), cobalt, or aluminum.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device structure comprising:
   a semiconductor substrate;
   a semiconductor fin extending from a surface of the semiconductor substrate, wherein the semiconductor fin comprises a first fin portion and a second fin portion above the first fin portion;
   an isolation region on the surface of the semiconductor substrate positioned laterally adjacent to the first fin portion of the semiconductor fin, wherein the isolation region has a first isolation portion in contact with the first fin portion of the semiconductor fin and a second isolation portion above and narrower than the first isolation portion so as to be physically separated from the second fin portion of the semiconductor fin by a space;
   a dielectric layer extending over the second fin portion of the semiconductor fin and over the second isolation portion of the isolation region; and
   a conductor layer on the dielectric layer, wherein the dielectric layer fills the space between the second fin portion of the semiconductor fin and the second isolation portion of the isolation region such that the conductor layer is entirely above a level of a top of the second isolation portion of the isolation region.

2. The semiconductor device structure of claim 1, wherein a top of the semiconductor fin is above a level of the top of the second isolation portion of the isolation region.

3. The semiconductor device structure of claim 2, wherein, between a level of a top of the first isolation portion and the level of the top of the second isolation portion, a width of the semiconductor fin decreases such that a distance between the semiconductor fin and the second isolation portion increases.

4. The semiconductor device structure of claim 2, wherein, above the level of the top of the second isolation portion, the semiconductor fin has an approximately uniform width.

5. The semiconductor device structure of claim 1,
   wherein the dielectric layer comprises a gate dielectric layer on a top surface and opposing sides of the second fin portion of the semiconductor fin, and
   wherein the conductor layer comprises a gate conductor layer on the gate dielectric layer.

6. The semiconductor device structure of claim 5, further comprising an oxide layer immediately adjacent to the top surface and the opposing sides of the second fin portion, wherein the gate dielectric layer comprises a high-K gate dielectric layer immediately adjacent to the oxide layer.

7. The semiconductor device structure of claim 5, further comprising a first oxide layer immediately adjacent to the top surface and the opposing sides of the second fin portion, wherein the dielectric layer comprises multiple different conformal dielectric layers comprising: a second oxide layer on the first oxide layer and the gate dielectric layer on the second oxide layer, wherein the gate dielectric layer comprises a high-K gate dielectric layer.

8. The semiconductor device structure of claim 1, wherein the dielectric layer comprises two different conformal dielectric layers.

9. The semiconductor device structure of claim 5, wherein the gate dielectric layer comprises a high-K gate dielectric layer immediately adjacent to the second fin portion.

10. The semiconductor device structure of claim 5, wherein the gate conductor layer comprises a metal gate conductor layer.

11. A semiconductor device structure comprising:
    a semiconductor substrate;
    a semiconductor fin having a first fin portion extending from a surface of the semiconductor substrate and a second fin portion above the first fin portion; and
    isolation regions on the surface of the semiconductor substrate and positioned laterally adjacent to opposing sides of the semiconductor fin, wherein each isolation region has a first isolation portion in contact with the first fin portion of the semiconductor fin and a second isolation portion above and narrower than the first isolation portion so as to be physically separated from second fin portion of the semiconductor fin by a space;

a dielectric layer extending over the second fin portion of the semiconductor fin and over the second isolation portion of each isolation region; and a conductor layer on the dielectric layer, wherein the dielectric layer completely fills the spaces between the second fin portion of the semiconductor fins and the second isolation portion of each isolation region such that the conductor layer is entirely above a level of a top surface of the second isolation portion of each isolation region.

12. A method comprising:

forming a semiconductor fin that extends from a surface of a semiconductor substrate wherein the semiconductor fin comprises a first fin portion and a second fin portion above the first fin portion;

forming an isolation region on the surface of the semiconductor substrate positioned laterally adjacent to the semiconductor fin, wherein the isolation region has a first isolation portion in contact with the first fin portion of the semiconductor fin and a second isolation portion above and narrower than the first isolation portion so as to be physically separated from the second fin portion of the semiconductor fin by a space;

forming a dielectric layer extending over the second fin portion of the semiconductor fin and over the second isolation portion of the isolation region; and forming a conductor layer on the dielectric layer, wherein the dielectric layer fills the space between the second fin portion of the semiconductor fin and the second isolation portion of the isolation region such that the conductor layer is entirely above a level of a top of the second isolation portion of the isolation region.

13. The method of claim 12, further comprising:

forming a sacrificial layer on the surface of the semiconductor substrate and adjacent to opposing sidewalls of the first fin portion;

forming sacrificial sidewall spacers on the second fin portion above the sacrificial layer; and selectively removing the sacrificial layer to expose the opposing sidewalls of the first fin portion and the surface of the semiconductor substrate, wherein the forming of the isolation region comprises:

depositing an isolation layer on the surface of the semiconductor substrate; and recessing the isolation layer to form the isolation region, wherein the recessing of the isolation layer is stopped when a level of a top surface of the isolation layer is below a level of a top of the semiconductor fin and above a level of bottoms of the sacrificial sidewall spacers.

14. The method of claim 13, further comprising:

selectively removing the sacrificial sidewall spacers; and performing an oxidation process to oxidize exposed surfaces of the second fin portion, wherein the performing of the oxidation process consumes semiconductor material at the exposed surfaces, and wherein a lesser amount of semiconductor material consumption occurs in a bottom section of the second fin portion such that a top section of the second fin portion has an approximately uniform width and such that the bottom section of the second fin portion is wider than the top section.

15. The method of claim 12, wherein the forming of the dielectric layer comprises forming a gate dielectric layer on a top surface and opposing sides of the second fin portion, and wherein the forming of the conductor layer comprises forming a gate conductor layer on the gate dielectric layer.

16. The method of claim 15, further comprising forming an oxide layer immediately adjacent to the second fin portion, wherein the forming of the gate dielectric layer further comprises forming a high-K gate dielectric layer immediately adjacent to the oxide layer.

17. The method of claim 15, further comprising forming a first oxide layer immediately adjacent to the second fin portion, wherein the forming of the dielectric layer comprises forming multiple different conformal dielectric layers comprising: a second oxide layer on the first oxide layer; and the gate dielectric layer comprising a high-K gate dielectric layer immediately adjacent to the second oxide layer.

18. The method of claim 15, wherein the forming of the gate dielectric layer comprises forming a high-K gate dielectric layer immediately adjacent to the second fin portion.

19. The method of claim 15, wherein the forming of the gate conductor layer comprises forming a metal gate conductor layer.

20. The method of claim 12, wherein the forming of the dielectric layer comprises forming two different conformal dielectric layers.

* * * * *